(12) United States Patent
Ifuku et al.

(10) Patent No.: US 9,893,269 B2
(45) Date of Patent: Feb. 13, 2018

(54) PIEZOELECTRIC ELEMENT, STATOR FOR OSCILLATORY WAVE MOTOR, OSCILLATORY WAVE MOTOR, DRIVING CONTROL SYSTEM, OPTICAL APPARATUS, AND METHOD FOR MAKING STATOR FOR OSCILLATORY WAVE MOTOR

(71) Applicant: CANON KABUSHIKI KAISHA, Tokyo (JP)

(72) Inventors: Toshihiro Ifuku, Yokohama (JP); Tatsuo Furuta, Machida (JP); Hiroshi Saito, Kawasaki (JP); Makoto Kubota, Yokohama (JP); Satoshi Fujita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 14/655,036

(22) PCT Filed: Dec. 19, 2013

(86) PCT No.: PCT/JP2013/085293
§ 371 (c)(1),
(2) Date: Jun. 23, 2015

(87) PCT Pub. No.: WO2014/104378
PCT Pub. Date: Jul. 3, 2014

(65) Prior Publication Data
US 2015/0349666 A1    Dec. 3, 2015

(30) Foreign Application Priority Data
Dec. 26, 2012    (JP) .................................. 2012-283088

(51) Int. Cl.
*H01L 41/047*    (2006.01)
*H01L 41/09*    (2006.01)
(Continued)

(52) U.S. Cl.
CPC .......... *H01L 41/257* (2013.01); *H01L 41/047* (2013.01); *H01L 41/1871* (2013.01);
(Continued)

(58) Field of Classification Search
CPC .... H01L 41/18; H01L 41/113; H01L 41/1132; G01H 11/08; G01L 1/16; G01P 15/09
(Continued)

(56) References Cited

U.S. PATENT DOCUMENTS

| 4,833,358 A | 5/1989 | Suzuki et al. |
| 6,288,475 B1 * | 9/2001 | Ito ......................... H02N 2/163 310/323.01 |
| 2009/0212662 A1 | 8/2009 | Ashizawa |

FOREIGN PATENT DOCUMENTS

| CN | 101182202 A | 5/2008 |
| CN | 101562438 A | 10/2009 |

(Continued)

*Primary Examiner* — Thomas Dougherty
(74) *Attorney, Agent, or Firm* — Canon U.S.A. Inc., IP Division

(57) ABSTRACT

The present invention provides a piezoelectric element that includes a piezoelectric material having first and second surfaces; a common electrode disposed on the first surface; and a plurality of drive phase electrodes, a detection phase electrode, and a non-drive phase electrode disposed on the second surface, the piezoelectric material being sandwiched between the common electrode and the electrodes on the second surface. An absolute value d(1) of a piezoelectric constant of the piezoelectric material (1) in portions sandwiched between the drive phase electrodes and the common electrode, an absolute value d(2) of a piezoelectric constant of the piezoelectric material (2) in a portion sandwiched between the detection phase electrode and the common electrode, and an absolute value d(3) of the piezoelectric material (3) in a portion sandwiched between the non-drive (Continued)

phase electrode and the common electrode satisfy d(2)<0.95d(1), d(3)<0.95d(1), and 0.9≤d(3)/d(2)≤1.1.

14 Claims, 10 Drawing Sheets

(51) Int. Cl.
- *H01L 41/113* (2006.01)
- *H01L 41/22* (2013.01)
- *H01L 41/257* (2013.01)
- *H01L 41/187* (2006.01)
- *H02N 2/14* (2006.01)
- *H01L 41/29* (2013.01)
- *H02N 2/16* (2006.01)

(52) U.S. Cl.
CPC .............. *H01L 41/29* (2013.01); *H02N 2/14* (2013.01); *H02N 2/163* (2013.01); *Y10T 29/43* (2015.01)

(58) Field of Classification Search
USPC ............ 310/316.01, 316.02, 323.01, 323.02, 310/323.04, 323.17; 29/25.35
See application file for complete search history.

(56) References Cited

FOREIGN PATENT DOCUMENTS

| | | |
|---|---|---|
| DE | 4131948 A1 | 4/1992 |
| EP | 0898313 A1 | 2/1999 |
| JP | S62-85684 A | 4/1987 |
| JP | S63161882 A | 7/1988 |
| JP | H01214273 A | 8/1989 |
| JP | 2692801 B2 | 12/1997 |
| JP | H11187677 A | 7/1999 |
| JP | H11206151 A | 7/1999 |
| JP | 2007287931 A | 11/2007 |
| JP | 2008120665 A | 5/2008 |
| JP | 2009189219 A | 8/2009 |
| JP | 2009-261116 A | 11/2009 |
| JP | 2012156493 A | 8/2012 |

* cited by examiner

PIEZOELECTRIC ELEMENT, STATOR FOR OSCILLATORY WAVE MOTOR, OSCILLATORY WAVE MOTOR, DRIVING CONTROL SYSTEM, OPTICAL APPARATUS, AND METHOD FOR MAKING STATOR FOR OSCILLATORY WAVE MOTOR

TECHNICAL FIELD

The present invention generally relates to piezoelectric elements, stators for oscillatory wave motors, oscillatory wave motors, driving control systems, optical apparatuses, and methods for making stators for oscillatory wave motors. In particular, it relates to a driving control system for an oscillatory type actuator such as an oscillatory motor, in which an electromechanical energy conversion element is used to oscillate vibrations in a vibrating member and the resulting oscillatory energy is used to generate driving force.

BACKGROUND ART

An oscillatory type (oscillatory wave) actuator includes an oscillator that oscillates driving vibrations in a ring-shape, prolate-ellipsoid-shape, or rod-shape elastic member in response to an electrical signal, such as AC voltage, applied to an electromechanical energy conversion element, such as a piezoelectric element. An example of the oscillatory type actuator suggested heretofore is an oscillatory wave motor in which an oscillator moves relative to an elastic member in pressure-contact with the oscillator.

A general structure of a ring-shape oscillatory wave motor is described below as an example.

A ring-shape oscillatory wave motor includes a piezoelectric material that has an inner diameter and an outer diameter such that the entire perimeter equals to an integral multiple of a particular length $\lambda$. A plurality of electrodes are disposed on one surface of the piezoelectric material and a common electrode is disposed on the other surface of the piezoelectric material to form a piezoelectric element.

The plurality of electrodes include two drive phase electrodes, a detection phase electrode, and a non-drive phase electrode. Electric fields of opposite directions are alternately applied at a $\lambda/2$ pitch to respective drive phase electrode portions of the piezoelectric material to conduct a polarization treatment. Accordingly, the polarity of expansion and contraction of the piezoelectric material with respect to the electric field in the same direction is reversed every $\lambda/2$ pitch. The two drive phase electrodes are spaced from each other by a distance equal to an odd multiple of $\lambda/4$. Usually, a non-drive phase electrode is formed in this gap portion to prevent the piezoelectric material in this portion from vibrating, and short-circuited with the common electrode via short-circuiting wires or the like.

The detection phase electrode is an electrode for detecting the vibrating state of the piezoelectric material. A strain generated in the piezoelectric material in the detection phase electrode portion is converted into an electrical signal corresponding to the piezoelectric constant of the piezoelectric material and output to the detection phase electrode.

A stator can be formed by connecting a wire for inputting and outputting power to this piezoelectric element and bonding a diaphragm composed of an elastic material to the piezoelectric element. When AC voltage is applied to one of the drive phase electrodes of the stator, a standing wave having a wavelength $\lambda$ occurs throughout the entire perimeter of the diaphragm. When AC voltage is applied only to the other drive phase, a standing wave occurs in a similar manner but the position of the standing wave is rotationally shifted in the circumferential by $\lambda/4$ with respect to the standing wave mentioned earlier.

A ring-shape oscillatory wave motor can be formed by bringing a ring-shape elastic member into pressure-contact with a surface of the stator opposite to the diaphragm so that the ring-shape elastic member can serve as a rotor.

Another type of oscillatory wave motor is an oscillatory wave motor in which electrodes and a diaphragm are attached to inner and outer sides of a ring-shape piezoelectric material and a rotor is in pressure-contact with the inner or outer side of the piezoelectric material. This type of motor can be driven by the rotation of the rotor caused by expansion and contraction (vibration) of the piezoelectric material.

When AC voltages having the same frequency and a time phase difference of $\pi/4$ are applied to the respective drive phase electrodes of the oscillatory wave motor, standing waves become combined, and a travelling wave (wavelength $\lambda$) of bending vibrations travelling in the circumferential direction occurs in the diaphragm.

During this process, the points that lie on the rotor-side of the diaphragm undergo a type of elliptical motion and the rotor rotates due to the frictional force from the diaphragm in the circumferential direction. The direction of rotation can be reversed by switching the phase difference between the AC voltages applied to the respective drive phase electrodes between plus and minus.

A driving control system capable of controlling the rotation speed can be formed by connecting a control circuit to the oscillatory wave motor. The control circuit includes a phase comparator that compares the phases and outputs a voltage value corresponding to the result of comparison.

When an oscillatory wave motor is driven, an electrical signal output from the detection phase electrode is input to a phase comparator along with an electrical signal applied to the drive phase electrode. The phase comparator outputs phase difference so that the degree of deviation from a resonant state can be detected. The data is used to determine the electrical signal applied to the drive phase electrode and to generate a desired travelling wave so that the rotation speed of the rotor can be controlled.

However, the value of voltage output from the detection phase electrode is usually larger than the input upper threshold voltage value of the phase comparator. Accordingly, for example, the oscillatory wave motor control system disclosed in PTL 1 provides a mechanism (step-down circuit) between the detection phase electrode and the phase comparator to decrease the voltage to a logic level.

CITATION LIST

Patent Literature

PTL 1 Japanese Patent Laid-Open No. 62-85684

SUMMARY OF INVENTION

Technical Problem

In recent years, motors such as electromagnetic motors have faced increasing demand for size reduction and cost reduction in parts. Accordingly, oscillatory wave motors have also been required to use fewer parts such as step-down circuits.

The present invention addresses such a challenge by providing a piezoelectric element capable of decreasing the output voltage for detection relative to the input voltage for driving without requiring a step-down circuit between a detection phase electrode and a phase comparator, which has been required in the related art. A stator for an oscillatory wave motor, an oscillatory wave motor, and an oscillatory wave motor driving control system that include the piezoelectric element are also provided.

Solution to Problem

The present invention provides a piezoelectric element comprising a single piece of a piezoelectric material having a first surface and a second surface, a common electrode disposed on the first surface, a plurality of drive phase electrodes disposed on the second surface, a detection phase electrode disposed on the second surface, and a non-drive phase electrode disposed on the second surface. The piezoelectric material is sandwiched between the common electrode and the drive phase electrodes, the detection phase electrode, and the non-drive phase electrode. An absolute value $d(1)$ of a piezoelectric constant of the piezoelectric material (1) in portions sandwiched between the plurality of drive phase electrodes and the common electrode, an absolute value $d(2)$ of a piezoelectric constant of the piezoelectric material (2) in a portion sandwiched between the detection phase electrode and the common electrode, and an absolute value $d(3)$ of the piezoelectric material (3) in a portion sandwiched between the non-drive phase electrode and the common electrode satisfy relationships $d(2)<0.95d(1)$, $d(3)<0.95d(1)$, and $0.9 \leq d(3)/d(2) \leq 1.1$.

The present invention also provides a stator for an oscillatory wave motor. The stator comprises the piezoelectric element according mentioned above, the piezoelectric element having a first surface and a second surface; a diaphragm disposed on the first surface; and a power input/output wire disposed on the second surface.

The present invention also provides an oscillatory wave motor comprising the stator for an oscillatory wave motor mentioned above.

The present invention also provides a driving control system comprising the oscillatory wave motor mentioned above.

The present invention also provides an optical apparatus comprising the driving control system mentioned above.

The present invention also provides a method for producing the stator for an oscillatory wave motor mentioned above. The method comprises (A) forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as to polarize the piezoelectric material and obtain a piezoelectric element; and (B) selecting which of the polarizing electrodes are to be a detection phase electrode and a non-drive phase electrode and connecting a power input/output wire to a part of a surface of the detection phase electrode and a part of a surface of the non-drive phase electrode at a temperature equal to or higher than a depolarization temperature Td of the piezoelectric material.

The present invention also provides a method for producing the stator for an oscillatory wave motor mentioned above. The method comprises (A) forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as to polarize the piezoelectric material and obtain a piezoelectric element; (B) selecting which of the polarizing electrodes are to be a detection phase electrode and a non-drive phase electrode and connecting a power input/output wire to a part or all parts of a surface of the detection phase electrode and a part or all parts of a surface of the non-drive phase electrode at a temperature equal to or higher than a depolarization temperature Td of the piezoelectric material; and (C) re-polarizing the piezoelectric material in portions sandwiched between the detection phase electrode and the common electrode and between the non-drive phase electrode and the common electrode.

Further features of the present invention will become apparent from the following description of exemplary embodiments with reference to the attached drawings.

DESCRIPTION OF EMBODIMENTS

Embodiments of the invention will now be described. A ring-shape oscillatory wave motor is described below as an embodiment implementing the invention. However, the invention is not limited to the ring-shape oscillatory wave motor and may be applied to any other appropriate types of motors such as multilayer oscillatory wave motors and rod-shape oscillatory wave motors.

A piezoelectric element according to an embodiment includes a single piece of piezoelectric material having a first surface and a second surface; a common electrode disposed on the first surface of the piezoelectric material; and plural drive phase electrodes, a detection phase electrode, and a non-drive phase electrode that are disposed on the second surface of the piezoelectric material. An absolute value $d(1)$ of a piezoelectric constant of the piezoelectric material (1) in portions sandwiched between the drive phase electrodes and the common electrode, an absolute value $d(2)$ of a piezoelectric constant of the piezoelectric material (2) in a portion sandwiched between the detection phase electrode and the common electrode, and an absolute value $d(3)$ of a piezoelectric constant of the piezoelectric material (3) in a portion sandwiched between the non-drive phase electrode and the common electrode satisfy the relationships $d(2)<0.95d(1)$, $d(3)<0.95d(1)$, and $0.9 \leq d(3)/d(2) \leq 1.1$.

Figure 1A:
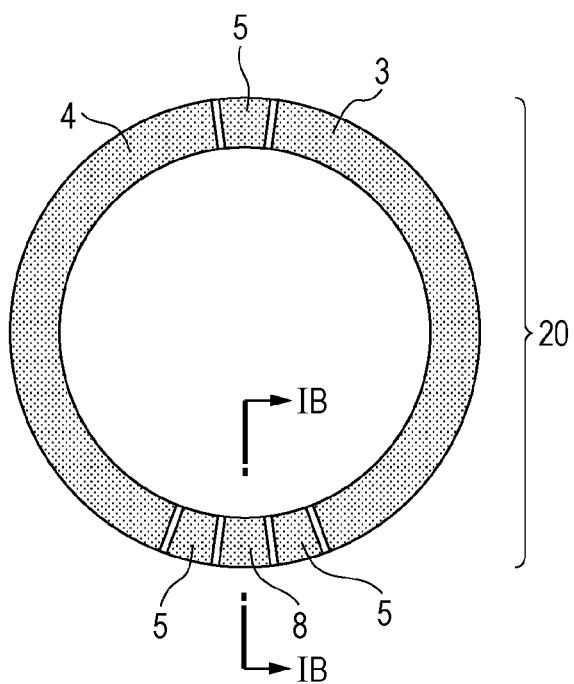
FIGS. 1A to 1C are schematic views showing an embodiment of a piezoelectric element according to one embodiment.
Figure 1B:
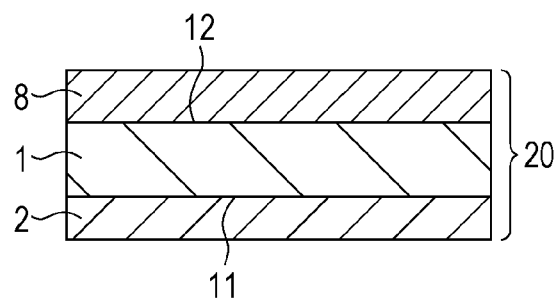
Figure 1C:
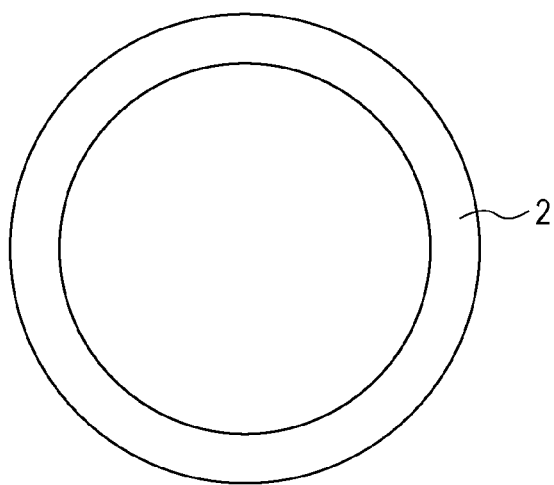

FIGS. 1A to 1C are schematic diagrams showing one embodiment of a piezoelectric element. FIG. 1A is a schematic plan view of the piezoelectric element. FIG. 1B is a cross-sectional view of the piezoelectric element taken along line IB-IB in FIG. 1A.

Referring to FIG. 1A, a piezoelectric element 20 according to an embodiment of the present invention includes a piezoelectric material 1 having a first surface 11 and a second surface 12; a common electrode 2 disposed on the first surface 11 of the piezoelectric material 1; and drive phase electrodes 3 and 4, a detection phase electrode 8, and non-drive phase electrodes 5 disposed on the second surface 12 of the piezoelectric material 1. In other words, the piezoelectric material 1 is sandwiched between these electrodes. The piezoelectric material 1 is, for example, a single piece of a piezoelectric material having a ring shape and an approximately uniform thickness of 0.5 mm. The drive phase electrode 3 is an electrode formed on a first drive phase (this phase is hereinafter referred to as the A phase) and the drive phase electrode 4 is an electrode formed on a second drive phase (this phase is hereinafter referred to as the B phase). One or more gaps each having a length of an odd multiple of $\lambda/4$ are formed between the drive phase electrodes 3 and 4. A detection phase electrode 8 or a non-drive phase electrode 5 is disposed in each gap portion. The detection phase electrode 8 is an electrode formed on a detection phase. The non-drive phase electrode 5 is an electrode formed on a non-drive phase which does not undergo spontaneous piezoelectric vibration. The detection phase is a portion of the piezoelectric material 1 sandwiched between the common electrode 2 and the detection phase electrode 8. The non-drive phase is a portion of the piezoelectric material 1 sandwiched between the common electrode 2 and the non-drive phase electrode 5.

Referring to FIG. 1C, the common electrode 2 is arranged to have a ring shape. In this description, "a single piece of a piezoelectric material 1" means a piezoelectric ceramic material that is seamless and has a homogeneous composition obtained by simultaneously firing raw materials weighed to have the same composition as the resulting piezoelectric material. The drive phase electrodes 3 and 4 and the detection phase electrode 8 are disposed on the same surface (second surface) of the piezoelectric material 1. The common electrode 2 (ground electrode) for the drive phase electrodes 3 and 4 and the detection phase electrode 8 is disposed on the opposite surface (first surface) of the piezoelectric material 1.

The piezoelectric material in the drive phases, namely, the A phase and the B phase, is subjected to a polarization treatment of applying electric fields alternately in reversed directions at $\lambda/2$ pitches. Accordingly, the polarity of expansion and contraction for an electric field in one direction is reversed every $\lambda/2$ pitch. The drive phase electrodes of the A phase and the B phase are spaced from each other with at least one gap therebetween and each gap has a length of an odd multiple of $\lambda/4$. The term "polarity of expansion and contraction" refers to the sign (+ or −) of stress and strain in an in-plane or out-of-plane direction with respect to the direction of the electric field.

The detection phase electrode 8 is disposed on the second surface 12 of the piezoelectric material 1 and in a place other than where the drive phase electrodes 3 and 4 are formed. For example, the detection phase electrode 8 has a length other than an integral multiple of $\lambda$ in the circumferential direction and, for example, has a length of $\lambda/4$. The non-drive phase electrode 5 is disposed on the second surface 12 of the piezoelectric material 1 and in a place other than where the drive phase electrodes 3 and 4 and the detection phase electrode 8 are formed. The non-drive phase electrode 5 has a length of, for example, $\lambda/4$ in the circumferential direction.

The absolute value d(1) of the piezoelectric constant of the piezoelectric material (1) in portions sandwiched between the drive phase electrodes 3 and 4 and the common electrode 2, the absolute value d(2) of the piezoelectric constant of the piezoelectric material (2) in a portion sandwiched between the detection phase electrode 8 and the common electrode 2, and the absolute value d(3) of the piezoelectric constant of the piezoelectric material (3) in the portions sandwiched between the non-drive phase electrodes 5 and the common electrode 2 satisfy the relationships $d(2)<0.95d(1)$, $d(3)<0.95d(1)$, and $0.9 \leq d(3)/d(2) \leq 1.1$. In other words, the absolute value d(2) of the piezoelectric constant of the piezoelectric material (2) in a portion sandwiched between the detection phase electrode 8 and the common electrode 2 and the absolute value d(3) of the piezoelectric constant of the piezoelectric material (3) in the portions sandwiched between the non-drive phase electrodes 5 and the common electrode 2 are smaller than the absolute value d(1) of the piezoelectric constant of the piezoelectric material (1) in the portions sandwiched between the drive phase electrodes 3 and 4 and the common electrode 2. The difference between the absolute value d(2) of the piezoelectric constant of the piezoelectric material (2) in the portion sandwiched between the detection phase electrode 8 and the common electrode 2 and the absolute value d(3) of the piezoelectric constant of the piezoelectric material in the portions sandwiched between the non-drive phase electrodes 5 and the common electrode 2 is about 10% or less of the absolute value d(2).

The phrase "portion sandwiched between the detection phase electrode 8 and the common electrode 2" refers to a region where lines perpendicular to the surfaces of the detection phase electrode 8 and the common electrode 2 intersect the piezoelectric material. Note that in the case where the detection phase electrode 8 and the common electrode 2 are not parallel to each other, this portion refers to a region where lines perpendicular to the detection phase electrode 8 and a portion of the surface of the common electrode 2 to which the detection phase electrode 8 is projected intersect the piezoelectric material. This definition also applies hereinafter to the phrase "portion(s) sandwiched between" and thus to phrases such as "portion(s) sandwiched between non-drive phase electrode(s) 5 and the common electrode 2" and to "portions sandwiched between the drive phase electrodes 3 and 4 and the common electrode 2".

In general, a ceramic is composed of a group of fine crystals and each crystal is constituted by atoms having positive charges and atoms having negative charges. In most ceramics, positive charges and negative charges are balanced. However, some dielectric ceramics which are called ferroelectric materials have imbalance of positive and negative charges in crystals and exhibit charge polarity (spontaneous polarization) even in a natural state.

Ferroelectric material ceramics after firing appear to have no charge imbalance as a whole since the directions of the spontaneous polarization are at random. Once a high voltage is applied to such a ceramic, the directions of the spontaneous polarization orient in the same direction and the ceramic does not return to the original state even after application of voltage is stopped. In general, this treatment of orienting the directions of the spontaneous polarization is referred to as a "polarization treatment". When an external voltage is applied to a polarized ferroelectric material ceramic, the center of the positive or negative charges inside the ceramic becomes attracted to or repels the external charges and thus the ceramic undergoes expansion and contraction (inverse piezoelectric effect). For the purposes of this specification, "a single piece of piezoelectric material" refers to a ceramic material that causes such a inverse piezoelectric effect as a result of a polarization treatment. It also refers to a single piece of ceramic material at least part of which is subjected to a polarization treatment.

If the piezoelectric material is not subjected to a polarization treatment, no inverse piezoelectric effect is generated. If the polarization treatment is insufficiently carried out, the inverse piezoelectric effect is smaller than when the polarization treatment is sufficiently carried out. In the case where a piezoelectric material is heat treated at a temperature equal to or higher than the depolarization temperature Td of the piezoelectric material, the inverse piezoelectric effect is significantly degraded. In the case where the heat treatment is performed at a temperature lower than the depolarization temperature Td but close to the depolarization temperature Td, the inverse piezoelectric effect may be degraded compared to when a heat treatment is not carried out. As such, the same piezoelectric material may exhibit different magnitudes of the inverse piezoelectric effect depending on the polarization treatment conditions, heat treatment conditions, etc.

The magnitude of the inverse piezoelectric effect may vary among parts of a single piece of piezoelectric material 1, for example, among the portion sandwiched between the detection phase electrode 8 and the common electrode 2, the portions sandwiched between the non-drive phase electrodes 5 and the common electrode 2, the portions sandwiched between the drive phase electrodes 3 and 4 and the common electrode 2, and the portions other than the aforementioned portions. This is because the polarization treatment conditions, the heat treatment conditions, and the like may locally vary within a single piece of a piezoelectric material.

In other words, the "piezoelectric constant of a piezoelectric material" refers to a piezoelectric constant in a particular part of a single piece of a piezoelectric material. For example, the piezoelectric constant of the piezoelectric material (2) in a portion sandwiched between the detection phase electrode and the common electrode refers to a piezoelectric constant in a portion of a single piece of the piezoelectric material 1 sandwiched between the detection phase electrode 8 and the common electrode 2.

Even within a part sandwiched between the detection phase electrode and the common electrode, for example, the magnitude of the inverse piezoelectric effect locally varies if only a part of such a part is subjected to a treatment such as a heat treatment at a temperature equal to or higher than the depolarization temperature Td. However, for the purposes of the present invention, a piezoelectric constant of a piezoelectric material refers to a piezoelectric constant of a particular part of a single piece of a piezoelectric material. For example, a piezoelectric constant of the piezoelectric material (2) in a portion sandwiched between the detection phase electrode and the common electrode refers to a piezoelectric constant of the whole portion sandwiched between the detection phase electrode 8 and the common electrode 2. This definition equally applies to the portions sandwiched between the non-drive phase electrodes 5 and the common electrode 2 and the portions sandwiched between the drive phase electrodes 3 and 4 and the common electrode 2. However, the portions sandwiched between the drive phase electrodes 3 and 4 and the common electrode 2 are larger in size than the whole portion sandwiched between the detection phase electrode 8 and the common electrode 2 and the whole portions sandwiched between the non-drive phase electrodes 5 and the common electrode 2. Thus, it is preferable to evaluate a part of the portions sandwiched between the drive phase electrodes 3 and 4 and the common electrode 2 and this part preferably has substantially the same area as that of the whole portion sandwiched between the detection phase electrode 8 and the common electrode 2 or the whole portion sandwiched between the non-drive phase electrode 5 and the common electrode 2. More preferably, a part that is located substantially at the center of each drive phase electrode and has substantially the same area as that of the whole portion sandwiched between the detection phase electrode 8 and the common electrode 2 or the whole portion sandwiched between the non-drive phase electrode 5 and the common electrode 2 is evaluated since such a portion represents the whole portions sandwiched between the drive phase electrodes 3 and 4 and the common electrode 2.

In measuring the piezoelectric constant of the piezoelectric material 1, a single piece of piezoelectric material 1 having a ring shape may be separated from a diaphragm 7 and a particular part of the piezoelectric material may be cut out and used for measurement by a Berlincourt method. To be more specific, in order to measure the absolute value d(1) of the piezoelectric constant of the piezoelectric material (1) in a portion sandwiched between the drive phase electrode and the common electrode, a sample may be cut out from an approximately center part of the drive phase electrode in such a manner that the sample has approximately the same area as the whole portion sandwiched between the detection phase electrode 8 and the common electrode 2 and the whole portion sandwiched between the non-drive phase electrode 5 and the common electrode 2, and may be measured through a Berlincourt method. In order to measure the absolute value d(2) of the piezoelectric constant of the piezoelectric material (2) in a portion sandwiched between the detection phase electrode and the common electrode, the entire portion sandwiched between the detection phase electrode 8 and the common electrode 2 is cut out and measured through a Berlincourt method. In order to measure the absolute value d(3) of the piezoelectric constant of the piezoelectric material (3) in a portion sandwiched between the non-drive phase electrode and the common electrode, the entire portion sandwiched between the non-drive phase electrode 5 and the common electrode 2 is cut out and measured through a Berlincourt method.

The piezoelectric constant that can be measured by the Berlincourt method is a constant $d_{33}$ resulting from the direct piezoelectric effect. In general, the piezoelectric constant d of a ring-shape oscillatory wave motor that uses flexural vibrations refers to the amount of strain that occurs at a plane perpendicular to an electric field under application of a unit electric field between electrodes (inverse piezoelectric effect), and is either $d_{31}$ or $d_{32}$. The piezoelectric constant d of a ring-shape, multilayer, or rod-shape oscillatory wave motor that uses longitudinal vibrations or shear vibrations refers to the amount of strain that occurs in the direction of an electric field under application of a unit electric field between electrodes (inverse piezoelectric effect), and is either $d_{33}$ or $d_{15}$.

In the present invention, the absolute value d(1) of the piezoelectric constant of the piezoelectric material (1) in portions sandwiched between the drive phase electrodes and the common electrode need be compared with the absolute value d(2) of the piezoelectric constant of the piezoelectric material (2) in a portion sandwiched between the detection phase electrode and the common electrode and with the absolute value d(3) of the piezoelectric constant of the piezoelectric material (3) in portions sandwiched between the non-drive phase electrodes and the common electrode. Accordingly, the piezoelectric constants of the respective portions sandwiched between the electrodes can be compared by evaluating the absolute values of the constants $d_{33}$ by the above-mentioned method.

In the piezoelectric element 20, the absolute value d(2) of the piezoelectric constant of the piezoelectric material (2) (hereinafter may be simply referred to as "absolute value d(2)") is smaller than the absolute value d(1) of the piezoelectric constant of the piezoelectric material (1) (hereinafter may be simply referred to as "absolute value d(1)"). Thus, when the piezoelectric element 20 is driven, the voltage value output from a detection phase electrode becomes lower than the voltage value input to the drive phase electrode.

When the absolute value d(2) of the piezoelectric element 20 is different from the absolute value d(3) of the piezoelectric constant of the piezoelectric material (3) (hereinafter may be simply referred to as "absolute value d(3)") by about 10% or less of d(3), variation in strain or stress caused by polarization can be decreased throughout the entire ring-shape region in the circumferential direction. Accordingly, the yield of the piezoelectric elements 20 which easily suffer from flaws such as breaking and cracking can be improved. In addition, problems such as cracking, breaking, and adhesion failures that are likely to occur during bonding of the piezoelectric element 20 to the diaphragm 7 can be suppressed. Here, as shown in FIG. 1A, when two or more non-drive phase electrodes 5 are formed, at least one non-drive phase electrode 5 need to satisfy the above-mentioned relationship with the detection phase electrode 8. Among the non-drive phase electrodes 5, the non-drive phase electrode 5 close to the detection phase electrode 8 preferably satisfies the above-mentioned relationship. More preferably, the non-drive phase electrode 5 that is adjacent to the detection phase electrode 8 satisfies the above-mentioned relationship. When the non-drive phase electrode 5 and the detection phase electrode 8 that satisfy the above-mentioned relationship are adjacent to each other, the influence of the noise on the voltage output from the detection phase during detection of the vibrating state of the piezoelectric material can be reduced.

The absolute value d(2) of the piezoelectric constant of the piezoelectric material (2) is preferably 0.7 times the absolute value d(1) of the piezoelectric constant of the piezoelectric material (1) or less. The absolute value d(2) is preferably 0.01 times to 0.7 times the absolute value d(1) and more preferably 0.04 times to 0.4 times the absolute value d(1).

When the absolute value d(2) of the piezoelectric material (2) is equal to or lower than 0.7 times the absolute value d(1) of the piezoelectric material (1), the voltage value output from the detection phase electrode can be reduced to 0.5 times the voltage value input to the drive phase electrode or less during driving of the piezoelectric element 20. When the absolute value d(2) is equal to or higher than 0.01 times the absolute value d(1), the influence of the noise on the voltage output from the detection phase can be reduced. When the absolute value d(2) is equal to or higher than 0.04 times the absolute value d(1), failures such as breaking and cracking of the piezoelectric element 20, breaking and cracking that occur during bonding the piezoelectric element 20 to the diaphragm 7, disturbance of the travelling waves in the oscillatory wave motor, and the like can be addressed. The absolute value d(2) is greater than 0 and preferably 1 pC/N or more so that that portion of the piezoelectric material can function as a detection phase.

The piezoelectric material 1 of the piezoelectric element 20 has a lead content lower than 1000 ppm.

In general, piezoelectric materials of most piezoelectric elements contain lead zirconate titanate as a main component. Accordingly, when piezoelectric elements are discarded, exposed to acid rain, or left in a severe environment, there is a risk that the lead component in the piezoelectric material will bleed into soil and harm the ecosystem. However, as long as the lead content is lower than 1000 ppm, the possibility that the lead component in the piezoelectric material will adversely affect the environment is low even if piezoelectric elements are discarded, exposed to acid rain, or left in a severe environment.

The lead content in the piezoelectric material 1 can be determined by measuring the amount of lead relative to the total weight of the piezoelectric material 1 determined by X-ray florescence analysis (XRF) or inductively coupled plasma (ICP) emission spectroscopy, for example.

The piezoelectric material 1 is a piezoelectric ceramic containing barium titanate as a main component. Among lead-free piezoelectric ceramics, a piezoelectric ceramic containing barium titanate as a main component exhibits a large absolute value d of the piezoelectric constant. Accordingly, the voltage required to yield the same amount of strain can be decreased. Thus, the piezoelectric material 1 may be a piezoelectric ceramic containing barium titanate as a main component also from the environmental viewpoint.

For the purposes of this specification, "ceramics" refer to those based on metal oxides and take form of aggregates (also referred to as bulks) of sintered crystal grains, namely, polycrystals. The word also refers to those which have been processed after sintering.

The piezoelectric material 1 may contain as a main component a perovskite-type metal oxide represented by general formula (1) below:

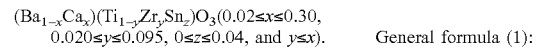

$(Ba_{1-x}Ca_x)(Ti_{1-y}Zr_ySn_z)O_3$ (0.02≤x≤0.30, 0.020≤y≤0.095, 0≤z≤0.04, and y≤x).  General formula (1):

The piezoelectric material 1 containing barium titanate as a main component has a temperature (Tr) at which phase transition occurs from a ferroelectric crystal phase to another ferroelectric crystal phase.

Here, the term "ferroelectric crystal phase" refers to a crystal phase of a ferroelectric material that belongs to one of the seven crystal systems, namely, triclinic, monoclinic, orthorhombic, hexagonal, trigonal, rhombohedral, and tetragonal systems.

The phase transition temperature Tr can be determined by measuring the dielectric constant of the piezoelectric element 20 while varying the measurement temperature using micro AC electric fields and determining the temperature at which the dielectric constant is maximal, for example. Alternatively, the phase transition temperature Tr can be determined from the temperature at which the crystal phase of the piezoelectric material 1 or the piezoelectric element 20 changes while varying the measurement temperature using X-ray diffraction or Raman spectroscopy. In general, the phase transition temperature from a first ferroelectric crystal phase to a second ferroelectric crystal phase (phase transition temperature in descending temperature) of a ferroelectric material slightly differs from the phase transition temperature from the second ferroelectric crystal phase to the first ferroelectric crystal phase (phase transition temperature in ascending temperature). In this description, the phase transition temperature Tr is a temperature at which the phase transition from the first ferroelectric crystal phase to the second ferroelectric crystal phase occurs, i.e., the phase transition temperature in descending temperature.

In general, the piezoelectric constant increases significantly, reaching its maximal at the phase transition temperature Tr. Accordingly, the change in piezoelectric constant with temperature is large near the phase transition temperature Tr and thus the amount of strain relative to the same input voltage changes. When such a piezoelectric material 1 is used in the piezoelectric element 20 to stabilize the amount of strain with changes in temperature, the piezoelectric element 20 can exhibit stable oscillation performance against temperature changes.

The phase transition temperature Tr is preferably outside the range of 0° C. or more and 35° C. or less and more preferably outside the range of −5° C. or more and 50° C. or less.

When the phase transition temperature Tr is outside the range of 0° C. or more and 35° C. or less, the change in amount of strain relative to the same input voltage can be suppressed to, for example, 20% or less against a change of 5° C. in temperature. When the phase transition temperature Tr is outside the range of −5° C. or more and 50° C. or less, the change in amount of strain relative to the same input voltage can be suppressed to, for example, 10% or less against a change of 5° C. in temperature.

In this description, a perovskite-type metal oxide refers to a metal oxide having a perovskite structure which is ideally a cubic crystal structure as described in Iwanami Rikagaku Jiten, 5th edition (published Feb. 20, 1998 by Iwanami Shoten Publishers). A metal oxide having a perovskite structure is usually expressed by a chemical formula, $ABO_3$. Element A and element B in a perovskite-type metal oxide take form of ions and occupy particular positions in a unit cell called A sites and B sites, respectively. For example, in a unit cell of a cubic crystal system, element A occupies vertexes of the cube and element B occupies the body-centered position of the cube. Element O is oxygen in the form of an anion and occupies face-centered positions of the cube.

In the metal oxide represented by general formula (1) above, barium (Ba) and calcium (Ca) are metal elements that occupy A sites and titanium (Ti), zirconium (Zr), and tin (Sn) are metal elements that occupy B sites. Note that some of the Ba and Ca atoms may occupy B sites and/or some of the Ti and Zr atoms may occupy A sites. However, it is not preferable to have Sn occupy A sites since the piezoelectric properties will be degraded.

In general formula (1), the molar ratio of the B-site element to O is 1:3. A metal oxide having a B:O ratio slightly deviated therefrom, e.g., 1.00:2.94 to 1.00:3.06, is still included in the scope of the present invention as long as the metal oxide has a perovskite structure as a main phase.

Structural analysis through X-ray diffraction or electron beam diffraction can be used to determine whether a metal oxide has a perovskite structure, for example.

In general formula (1), x represents the molar ratio of Ca in A sites and is in a range of $0.02 \leq x \leq 0.30$. When x is lower than 0.02, the dielectric loss (tan δ) is increased. When the dielectric loss is increased, the amount of heat generated when a voltage is applied to the piezoelectric element 20 to drive the piezoelectric element 20 is increased and the driving efficiency may be degraded. When x is greater than 0.30, the piezoelectric property may not be sufficient.

In general formula (1), y represents the molar ratio of Zr in B sites and is in a range of $0.020 \leq y \leq 0.095$. When y is lower than 0.020, the piezoelectric property may not be sufficient. When y is greater than 0.095, the Curie temperature ($T_c$) becomes lower than 85° C. and the piezoelectric property may be lost at high temperature.

In general formula (1), z represents the molar ratio of Sn in B sites and is in a range of $0 \leq z \leq 0.04$. When Sn in the B sites is contained in an amount of 0.04 mol or less, the dielectric loss is decreased in particular. If z is greater than 0.040, crystal grains become coarse and the amount of heat generated when the element is driven may be increased.

In this specification, a Curie temperature refers to a temperature at which ferroelectricity is lost. Examples of the method for detecting the temperature include a method of directly measuring the temperature at which ferroelectricity is lost by varying the measurement temperature and a method of measuring the dielectric constant using minute AC fields while varying the measurement temperature and determining the temperature at which the dielectric constant is maximal.

In general formula (1), the Ca molar ratio x and the Zr molar ratio y satisfy $y \leq x$. When $y > x$, the dielectric loss may increase and the insulating property may be insufficient. When all of the ranges concerning x and y described heretofore are satisfied simultaneously, the phase transition temperature Tr can be shifted from near room temperature to a temperature below the operating temperature range and thus the piezoelectric element 20 can be stably driven in a wide temperature range.

In general formula (1), the ratio A1/B1 of the molar amount A1 of Ba and Ca at A sites to the molar amount B1 of Ti, Zr, and Sn at B sites may be in the range of $1.00 \leq A1/B1 \leq 1.01$. When A1/B1 is smaller than 1.00, abnormal grain growth readily occurs and the mechanical strength of the piezoelectric material 1 is degraded. If A1/B1 is larger than 1.01, the temperature needed for grain growth becomes excessively high and thus a sufficient density may not be obtained by a typical firing furnace and many pores and defects may occur in the piezoelectric material 1.

The technique for determining the composition of the piezoelectric material 1 is not particularly limited. Examples of the technique include X-ray fluorescence analysis, inductively coupled plasma (ICP) atomic emission spectroscopy, and atomic absorption spectrometry. The weight ratios and compositional ratios of the elements contained in the piezoelectric material 1 can be determined by any of these techniques.

The piezoelectric material 1 contains a perovskite-type metal oxide represented by general formula (1) as a main component and manganese (Mn) incorporated in the metal oxide. The Mn content may be 0.02 parts by weight or more and 0.40 parts by weight or less on a metal basis relative to 100 parts by weight of the metal oxide.

When the Mn content is within the above-described range, the insulating property and the mechanical quality factor Qm are improved.

Here, the mechanical quality factor Qm refers to a factor that indicates an elastic loss caused by oscillation when the piezoelectric element is used as an oscillator. The magnitude of the mechanical quality factor is observed as a sharpness of a resonance curve in impedance measurement. In other words, the mechanical quality factor is a factor that indicates the sharpness of the resonance of a piezoelectric element. When the mechanical quality factor Qm is high, the amount of strain in the piezoelectric element near the resonance frequency is further increased and the piezoelectric element can be efficiently vibrated.

The term "on a metal basis" with reference to the Mn content refers to a value determined by first determining the oxide-based amounts of elements constituting the metal oxide represented by general formula (1) based on the Ba, Ca, Ti, Zr, Sn, and Mn contents measured by XRF, ICP atomic emission spectroscopy, atomic absorption spectroscopy, or the like and then calculating the ratio of the weight of Mn relative to 100 parts by weight of the total amount of the elements constituting the metal oxide.

When the Mn content is lower than 0.02 parts by weight, the effect of the polarization treatment is not sufficient to drive the piezoelectric element 20. When the Mn content is greater than 0.40 parts by weight, the piezoelectric property is not sufficient and crystals having a hexagonal structure not contributing to the piezoelectric property emerge.

Manganese may be dissolved in B sites. In such a case, the ratio A2/B2 (A2: molar amount of Ba and Ca at A sites, B2: molar amount of Ti, Zr, Sn, and Mn at B sites) may be in the range of $0.993 \leq A2/B2 \leq 0.998$. A piezoelectric element 20 having A2/B2 within this range expands and contracts significantly in the length direction of the piezoelectric element 20 and creates vibrations, and has a high mechanical quality factor. Thus, the piezoelectric element 20 having high oscillation performance and high durability can be obtained.

The valence of Mn may be 4+. Manganese can usually take a valence of 4+, 2+, or 3+. When conduction electrons are present in the crystals (for example, when oxygen deficiencies are present in the crystals or when a donor element occupies the A site), they become trapped as the valence of Mn decreases from 4+ to 3+ or 2+ and the insulation resistance can thereby be improved. From the viewpoint of ionic radius, the valence of Mn may be 4+ so that Ti, which is a main component of the B site, can be easily substituted.

In contrast, if the valence of Mn is lower than 4+, such as 2+, the Mn acts as an acceptor. When Mn that functions as an acceptor is present in the perovskite crystals, holes are generated in the crystals or oxygen vacancies are formed in the crystals.

When many of the Mn atoms added have a valence of 2+ or 3+, the holes cannot be compensated merely by introduction of oxygen vacancies and the insulation resistance is decreased. Accordingly, most of the Mn atoms may have a valence of 4+. A small number of Mn atoms may have a valence lower than 4+, occupy B sites of the perovskite structure and function as an acceptor, and form oxygen vacancies. This is because Mn atoms having a valence of 2+ or 3+ form defective dipoles with oxygen vacancies and the insulating property and the mechanical quality factor Qm of the piezoelectric element 20 can be improved.

The piezoelectric material 1 of the piezoelectric element 20 may contain components (hereinafter referred to as auxiliary components) other than the metal oxide represented by general formula (1) and Mn as long as the properties are not changed. The total content of the auxiliary components may be 1.2 parts by weight or less relative to 100 parts by weight of the metal oxide represented by general formula (1). When the auxiliary component content exceeds 1.2 parts by weight, the piezoelectric property and the insulating property of the piezoelectric material 1 may be degraded. The content of the metal elements other than Ba, Ca, Ti, Zr, Sn, and Mn among the auxiliary components is preferably 1.0 part by weight or less on an oxide basis or 0.9 parts by weight or less on a metal basis relative to the piezoelectric material 1. In this description, "metal elements" include semimetal elements such as Si, Ge, and Sb. When the content of the metal elements other than Ba, Ca, Ti, Zr, Sn, and Mn among the auxiliary components exceeds 1.0 part by weight on an oxide basis or 0.9 parts by weight on a metal basis relative to the piezoelectric material 1, the piezoelectric property and the insulating property of the piezoelectric material 1 may be significantly degraded. The total content of Li, Na, Mg, and Al among the auxiliary components may be 0.5 parts by weight or less on a metal basis relative to the piezoelectric material 1. When the total content of Li, Na, Mg, and Al among the auxiliary components exceeds 0.5 parts by weight on a metal basis relative to the piezoelectric material, insufficient sintering may occur. The total content of Y and V among the auxiliary components may be 0.2 parts by weight or less on a metal basis relative to the piezoelectric material. When the total content of Y and V exceeds 0.2 parts by weight on a metal basis relative to the piezoelectric material, it may become difficult to perform a polarization treatment.

Examples of the auxiliary components include sintering aids such as Si and Cu. Commercially available Ba and Ca raw materials contain Sr as an unavoidable impurity and thus the piezoelectric material may contain impurity amounts of Sr. Similarly, a commercially available Ti raw material contains Nb as an unavoidable impurity and a commercially available Zr raw material contains Hf as an unavoidable impurity. Thus, the piezoelectric material 1 may contain impurity amounts of Nb and Hf.

The technique for measuring the weights of the auxiliary components is not particularly limited. Examples of the technique include X-ray fluorescence analysis (XRF), ICP atomic emission spectroscopy, and atomic absorption spectrometry.

A stator for an oscillatory wave motor according to an embodiment of the invention will now be described. The stator includes the above-described piezoelectric element that includes a piezoelectric material having a first surface and a second surface, a common electrode on the first surface, and a plurality of drive phase electrodes, a detection phase electrode, and a non-drive phase electrode on the second surface; a diaphragm disposed on a first surface of the piezoelectric element; and a power input/output wire disposed on a second surface of the piezoelectric element.

Figure 2A:
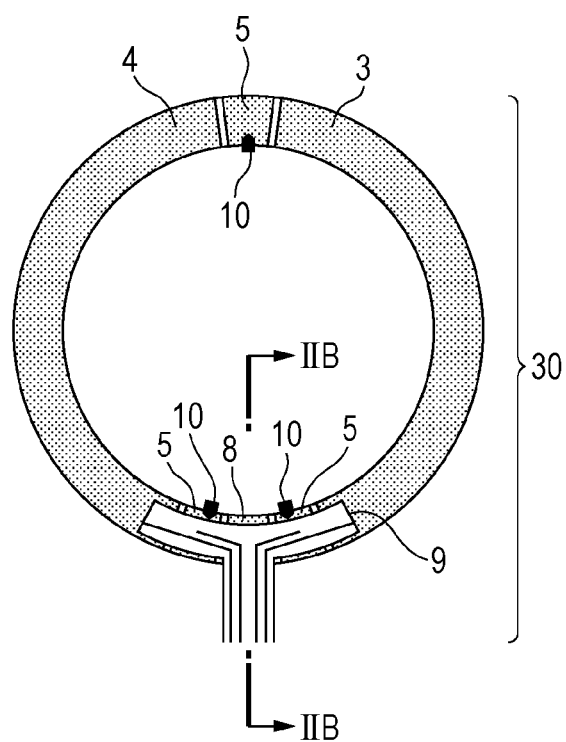
FIGS. 2A and 2B are schematic diagrams showing an embodiment of a stator for an oscillatory wave motor.
Figure 2B:
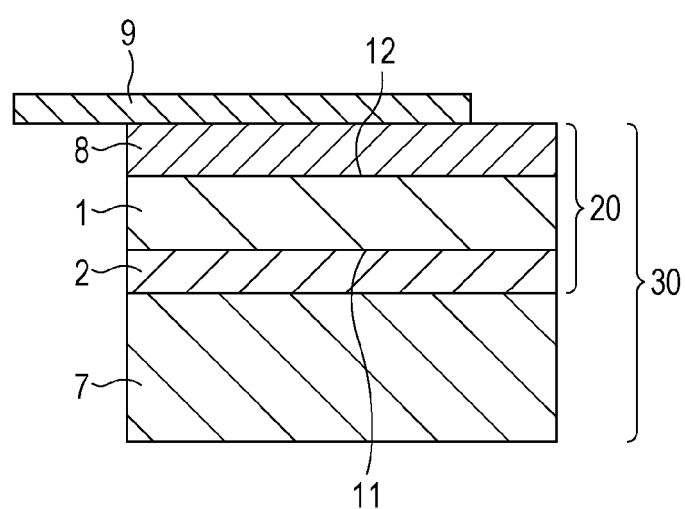

FIGS. 2A and 2B are schematic views showing a structure of a stator for an oscillatory wave motor according to an embodiment of the present invention. FIG. 2A is a schematic plan view of the stator and FIG. 2B is a cross-sectional view of the stator taken along line IIB-IIB in FIG. 2A.

Referring to FIG. 2B, a stator 30 for an oscillatory wave motor includes the piezoelectric element 20 and a diaphragm 7 composed of an elastic material on the common electrode 2 on one surface of the piezoelectric element 20. A power input/output wire 9 is disposed on the other surface of the common electrode 20.

Referring to FIG. 2A, the input/output wire 9 of the stator 30 is equipped with an electric wire for supplying power to the drive phase electrodes 3 and 4, an electric wire connected to the common electrode 2 via the non-drive phase electrode 5, and an electric wire for transmitting an electrical signal output from the detection phase electrode 8 and is connected to the respective electrode phases.

As shown in FIG. 2A, the non-drive phase electrodes 5 are electrically connected (short-circuited) with short-circuiting wires 10 so that the non-drive phase electrodes 5 have the same potential as the common electrode 2 and the diaphragm 7. Thus, for example, when the input/output wire 9 equipped with a number of wires corresponding to the respective electrodes is attached from above by using an anisotropic conductive film, at least one wire and the common electrode 2 are shorted through the non-drive phase electrode 5. Since all of the non-drive phase electrodes 5 are shorted with the common electrode 2, spontaneous piezoelectric vibrations do not occur.

In this stator 30 for an oscillatory wave motor, a standing wave vibration oscillated by application of AC voltage to the drive phase electrode 3 in the A phase is referred to as an A-phase standing wave. A standing wave vibration oscillated by application of AC voltage of the same frequency to the drive phase electrode 4 in the B phase is referred to as a B-phase standing wave. An A-phase standing wave and a B-phase standing wave having the same amplitude are generated simultaneously such that the phase difference in time is 90° so that a travelling oscillatory wave is oscillated as a result of combination of the two standing waves.

In the stator 30 for an oscillatory wave motor, the travelling wave of bending vibration travelling in the circumferential direction is sometimes disturbed by superimposition of the vibration other than the wavelength $\lambda$ and the difference in maximum amplitude of the travelling wave among different positions. However, in the piezoelectric element 20, the disturbance of the travelling wave can be decreased since the difference between the absolute value d(2) and the absolute value d(3) is 10% or less of the absolute value d(3).

An oscillatory wave motor according to an embodiment of the invention includes a stator for an oscillatory wave motor.

Figure 3A:
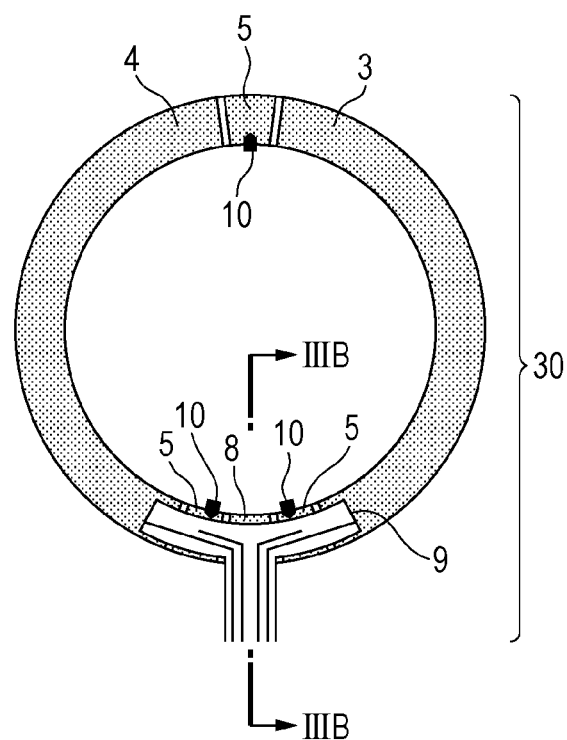
FIGS. 3A and 3B are schematic diagrams showing an embodiment of an oscillatory wave motor.
Figure 3B:
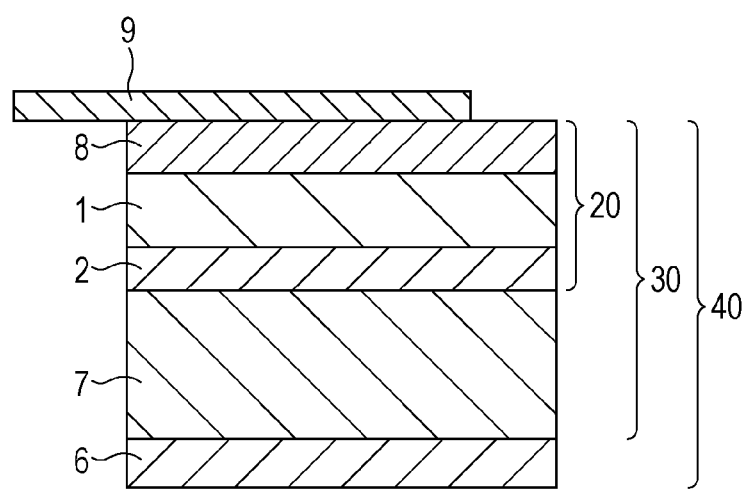

FIGS. 3A and 3B are schematic views showing a structure of an oscillatory wave motor. FIG. 3A is a schematic plan view of the oscillatory wave motor and FIG. 3B is a cross-sectional view of the oscillatory wave motor taken along line IIIB-IIIB in FIG. 3A.

An oscillatory wave motor 40 shown in FIG. 3B includes a rotor 6 on a surface of the diaphragm 7 of the stator 30 for the oscillatory wave motor. For example, a ring-shape rotor 6 composed of an elastic material is brought into pressure-contact with the surface of the diaphragm 7, which is a surface opposite to the input/output wire 9. When a travelling wave is oscillated in the stator 30, points on the diaphragm 7 surface opposite to the piezoelectric element 20 undergo a type of elliptic motion. The rotor thus receives a frictional force from the diaphragm 7 in the circumferential direction and is rotated. The rotation direction can be reversed by switching the sign of the phase difference of the AC voltage applied to the drive phase electrodes 3 and 4.

The rotation rate of the oscillatory wave motor relative to the input voltage varies in the oscillatory wave motor 40. However, as long as the difference between the absolute value d(2) and the absolute value d(3) is within 10% of the absolute value d(3) in the piezoelectric element 20, the disturbance of the travelling wave oscillated by the stator 30 for an oscillatory wave motor can be reduced and variation of the rotation rate of the oscillatory wave motor relative to the input voltage can be suppressed.

A driving control system according to an embodiment of the present invention includes an oscillatory wave motor.

Figure 4:
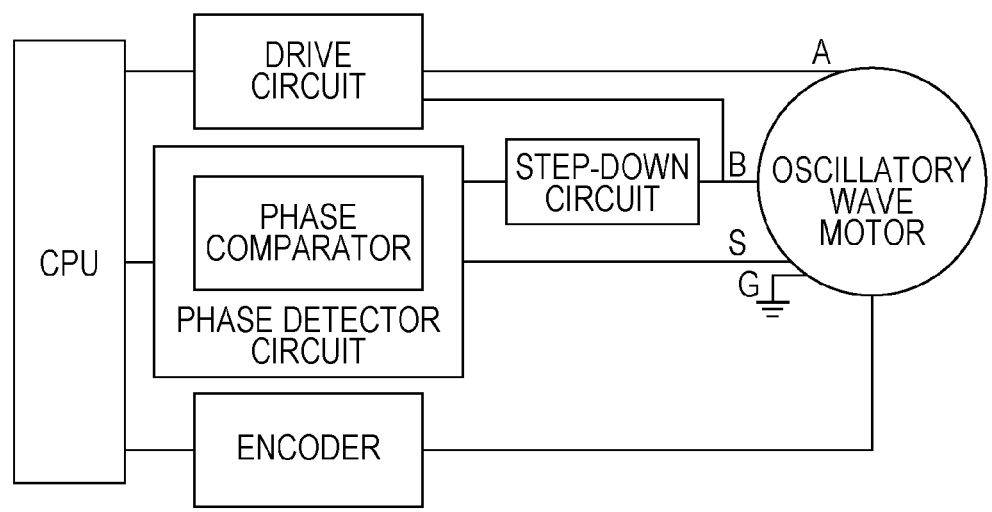
FIG. 4 is a circuit diagram showing an embodiment of a driving control system.

FIG. 4 is a schematic diagram of a circuit according to one embodiment of a driving control system.

FIG. 4 is a simplified control circuit diagram of the driving control system. The oscillatory wave motor shown in FIG. 4 is similar to that shown in FIGS. 3A and 3B and includes an A-phase electrode A of the piezoelectric element 20 of the oscillatory wave motor, a B-phase electrode B, a detection phase electrode S, and a common electrode G. These electrodes are eclectically isolated from one another and connected to the input/output wire 9.

Referring to FIG. 4, an electrical signal output from a central processing unit (CPU) is input to the A phase and the B phase through a drive circuit while the voltage phase is being shifted by $\pi/2$. The electrical signal input to the B phase is simultaneously input to a phase detector circuit via a step-down circuit. When a travelling wave is oscillated in the oscillatory wave motor, the piezoelectric material in a portion sandwiched between the detection phase electrode and the common electrode vibrates and an electrical signal is output from the detection phase electrode. The output electrical signal is directly input to the phase detector circuit without passing through a step-down circuit. These two electrical signals are input to the phase comparator in the phase detector circuit and an electrical signal corresponding to the phase difference between the two electrical signals is output from the phase detector circuit to the CPU. During this process, an electrical signal output from an encoder for optically measuring the speed of rotation of the oscillatory wave motor is output to the CPU. According to this configuration, a step-down circuit between the detection phase electrode and the phase comparator which has been necessary in the related art can be omitted.

Based on the difference between the speed of rotation of the oscillatory wave motor and the speed of rotation designated by a drive command signal (not shown in the drawing) and the electrical signals output from the phase detector circuit, an electrical signal is again output from the CPU to the drive circuit on the basis of a preset logic to perform feedback control.

Next, an optical apparatus according to one embodiment of the invention is described. The optical apparatus includes the driving control system described above in a drive unit.

Figure 5A:
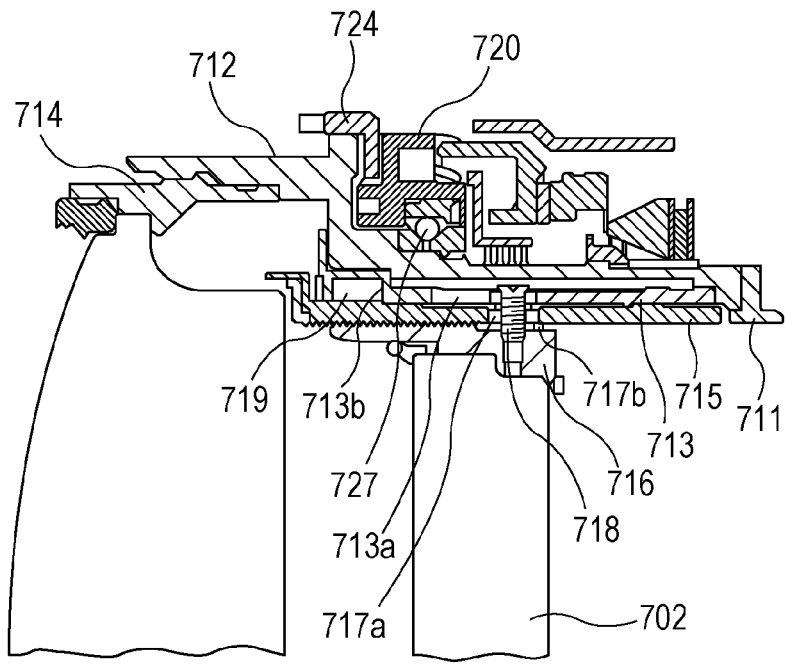
FIGS. 5A and 5B are schematic views showing an embodiment of an optical apparatus.
Figure 5B:
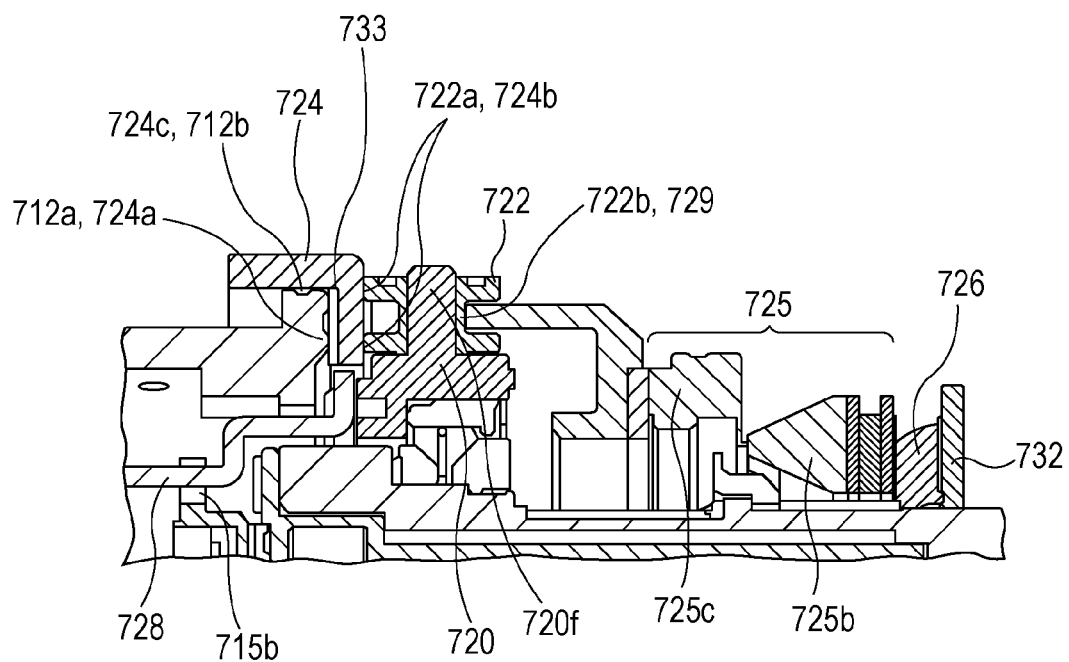
Figure 6:
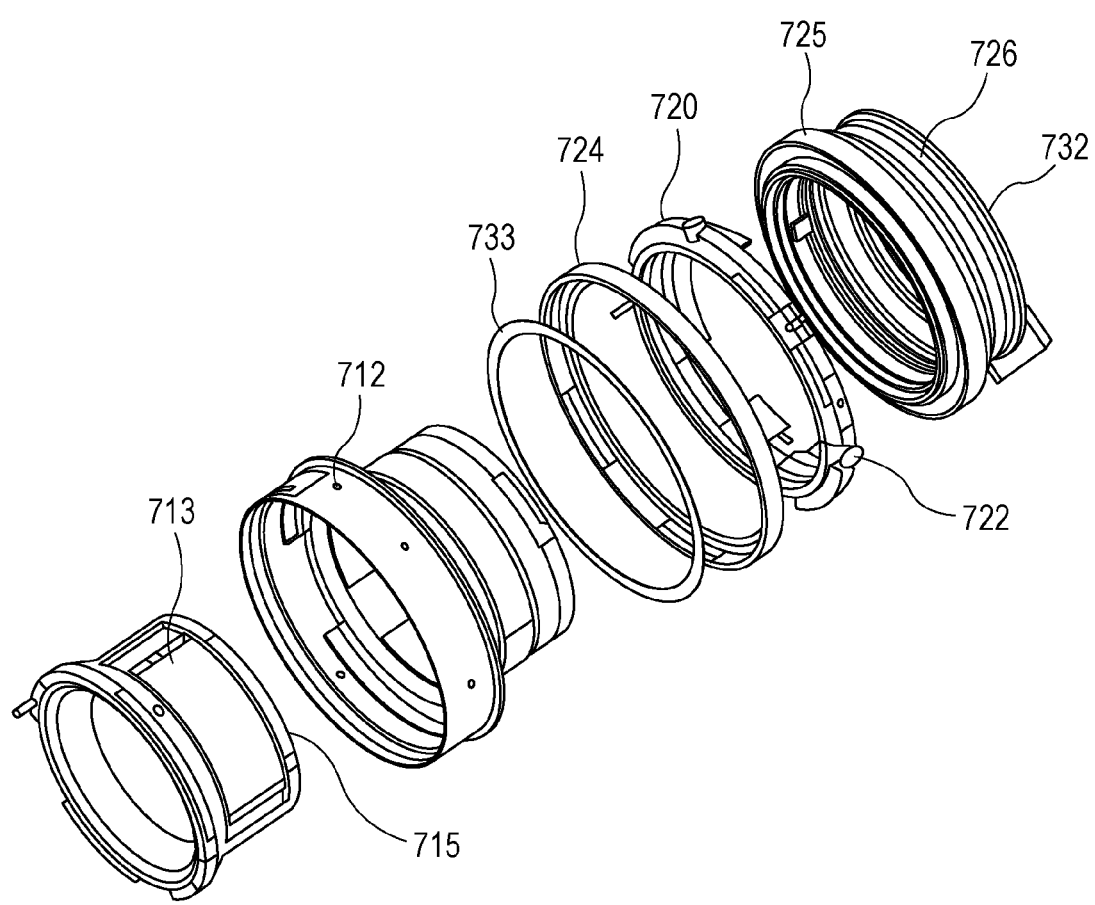
FIG. 6 is a schematic view showing the optical apparatus.

FIGS. 5A and 5B are sectional views of a related part of a replaceable lens barrel of a single-lens reflex camera, which is an example of the optical apparatus. FIG. 6 is an exploded perspective view of the replaceable lens barrel. A fixed barrel 712, a linear guide barrel 713, and a front lens group barrel 714 are fixed to a mount 711 detachable from and attachable to a camera. These are fixed members of the replaceable lens barrel.

A linear guide groove 713a extending in an optical axis direction is formed in the linear guide barrel 713 to guide a focus lens 702. A cam roller 717a and a cam roller 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is inhibited since a roller 719 fixed to the cam ring 715 is fitted in an annular groove 713b of the linear guide barrel 713. A cam groove for the focus lens 702 is formed in the cam ring 715. The cam roller 717b is fitted in the cam groove.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720, and a large-diameter portion 722a of the roller 722 is in contact with a mount-side end surface 724b of a manual focus ring 724. A small-diameter portion 722*b* of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner radial portion of the manual focus ring 724. The low-friction sheet 733 is interposed between a mount-side end surface 712*a* of the fixed barrel 712 and a front-side end surface 724*a* of the manual focus ring 724. The outer radial surface of the low-friction sheet 733 has a ring shape and is fitted in an inner radial portion 724*c* of the manual focus ring 724. The inner radial portion 724*c* of the manual focus ring 724 is fitted in an outer radial portion 712*b* of the fixed barrel 712. The low-friction sheet 733 reduces the friction in a rotary ring mechanism in which the manual focus ring 724 is rotated relative to the fixed barrel 712 about the optical axis.

The large-diameter portion 722*a* of the roller 722 and a mount-side end surface 724*b* of the manual focus ring 724 contact each other under pressure by being pressed by a wave washer 726 that presses an oscillatory wave motor 725 toward the front side of the lens. The force from the wave washer 726 pressing the oscillatory wave motor 725 toward the front side of the lens also causes the small-diameter portion 722*b* of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the oscillatory wave motor 725 and to the roller 722 and serves as thrusting force of the manual focus ring 724 against the mount-side end surface 712*a* of the fixed barrel 712. In other words, the manual focus ring 724 is assembled while being urged against the mount-side end surface 712*a* of the fixed barrel 712 via the low-friction sheet 733.

Accordingly, when the oscillatory wave motor 725 is driven and rotated with respect to the fixed barrel 712 by the control CPU shown in FIG. 4, the roller 722 rotates about the center of the shaft 720*f* because the joint member 729 makes frictional contact with the small-diameter portion 722*b* of the roller 722. As the roller 722 rotates about the shaft 720*f*, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720*f* since the mount-side end surface 724*b* of the manual focus ring 724 is in pressure-contact with the large-diameter portion 722*a* of the roller 722. As the large-diameter portion 722*a* of the roller 722 rotates about the shaft 720*f*, the rotation transmitting ring 720 is rotated about the optical axis. The oscillatory wave motor 725 at this time is prevented from rotating due to the frictional retention force of a rotor 725*c* and a diaphragm 725*b* (manual focusing operation).

Two focus keys 728 are installed in the rotation transmitting ring 720 at positions opposite to each other and fitted in notches 715*b* at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, the rear lens group barrel 716 inhibited from rotating due to the cam roller 717*a* and the linear guide groove 713*a* moves back and forth along the cam groove in the cam ring 715 by the cam roller 717*b*. This drives the focus lens 702 and focusing operation is conducted.

Although a replaceable lens barrel of a single-lens reflex camera has been described as an example of the optical apparatus of the present invention, the range of the optical apparatus is not limited to this. The optical apparatus may be any type of camera such as a compact camera, an electronic still camera, or the like. Any optical apparatus having an oscillatory wave motor or a driving control system in the drive unit is included in the scope of the invention.

Embodiments of a method for producing a stator for an oscillatory wave motor according to the invention will now be described.

A method for producing a stator for an oscillatory wave motor according to one embodiment include a step (A) of forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as polarize the piezoelectric material and obtain a piezoelectric element; and a step (B) of selecting which of the polarizing electrodes are to be a detection phase electrode and a non-drive phase electrode and connecting a power input/output wire to a part of a surface of the detection phase electrode and a part of a surface of the non-drive phase electrode at a temperature equal to or higher than a depolarization temperature Td of the piezoelectric material.

A method for producing a stator for an oscillatory wave motor according to another embodiment include a step (A) of forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as polarize the piezoelectric material and obtain a piezoelectric element; a step (B) of selecting which of the polarizing electrodes are to be a detection phase electrode and a non-drive phase electrode and connecting a power input/output wire to some or all parts of a surface of the detection phase electrode and some or all parts of a surface of the non-drive phase electrode at a temperature equal to or higher than a depolarization temperature Td of the piezoelectric material; and a step (C) of re-polarizing the piezoelectric material in portions sandwiched between the detection phase electrode and the common electrode and between the non-drive phase electrode and the common electrode.

FIGS. 7A to 7D are step diagrams showing an example of a method for producing a stator for an oscillatory wave motor.

First, a method for making a piezoelectric material used in the piezoelectric element is described.

To a raw material powder adjusted to have a desired composition, a dispersing agent, a binder, a plasticizer, and other additives if necessary, and water or an organic solvent are added, followed by mixing. The resulting mixture is press-formed under a pressure needed to form a high-density sintered body to prepare a compact. When the needed pressure is not achieved by press-forming alone, cold isostatic pressing (CIP) may be conducted to apply a required pressure. Alternatively, a compact ingot may be fabricated by CIP or the like without conducting press-forming. Alternatively, a slurry may be applied to a support, such as a film, to a particular thickness by a technique such as a doctor blade technique or a die coating technique and dried to form a green sheet compact.

Next, the compact is fired to fabricate a piezoelectric material in the sintered ceramic form. The firing conditions may be adequately selected according to the desired piezoelectric material. The density may be as high as possible and grain growth that attains uniform size may be conducted. If needed, the compact may be processed into a desired shape before firing.

Next, a method for making a piezoelectric element is described. After forming a common electrode on a first surface of the piezoelectric material and polarizing electrodes on a second surface of the piezoelectric material so as to sandwich the piezoelectric material, a voltage is applied to polarize the piezoelectric material and obtain a piezoelectric element (step A).

Figure 7A:
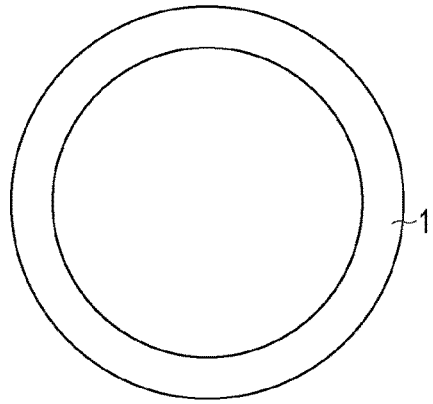
FIGS. 7A to 7D are step diagrams showing an example of a method for making a stator for an oscillatory wave motor according to one embodiment.
Figure 7B:
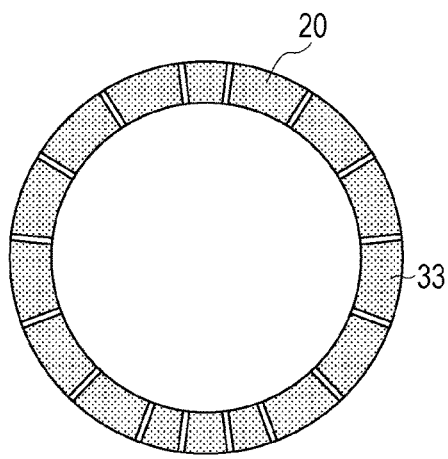

A sintered piezoelectric ceramic material prepared as described above is grinded into a desired size to fabricate a single piece of piezoelectric material 1 having a ring shape as shown in FIG. 7A. Then, as shown in FIG. 7B, polarizing electrodes 33 are formed on one of the surfaces of the piezoelectric material 1 and a common electrode 2 is formed over the entire opposite surface of the piezoelectric material 1 by baking a silver paste, Au sputtering, Au plating, or the like, so as to prepare a piezoelectric element 20.

The polarizing electrodes 33 may each be as wide as possible with respect to the surface of the piezoelectric material from the viewpoint of efficiency of oscillating vibrations. The distances between the electrodes may be as small as possible within a range that can prevent discharge between electrodes during polarization.

Next, the piezoelectric element 20 is polarized. The polarization treatment temperature may be equal to or lower than the Curie temperature Tc or depolarization temperature Td. The treatment time may be 5 minutes to 10 hours. The treatment atmosphere may be air or a noncombustible oil such as silicone oil. An electric field of 0.5 to 5.0 kV/mm is applied as the treatment voltage.

A depolarization temperature of a piezoelectric material is a temperature Td (° C.) up to which a polarized piezoelectric material after elapse of a sufficient time from the termination of the polarizing treatment is heated from room temperature so that the piezoelectric constant of the piezoelectric material after the heating and cooling to room temperature is smaller than the piezoelectric constant of the piezoelectric material before heating. For the purposes of this specification, the depolarization temperature Td is the temperature up to which the polarized piezoelectric material is heated, the polarized piezoelectric material after heating exhibiting a piezoelectric constant equal to or lower than 95% of the piezoelectric constant before the heating.

Figure 7C:
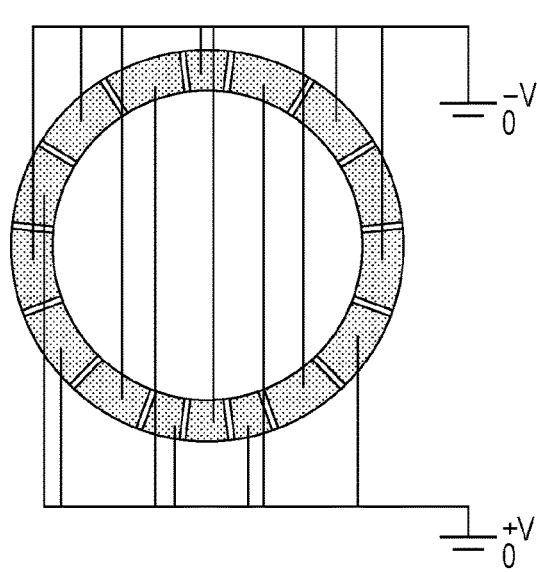

As shown in FIG. 7C, when a polarization treatment is performed by applying a particular electric field to the electrodes but with electric fields in opposite directions between adjacent electrodes, the polarity of expansion and contraction relative to a particular direction of the electric field becomes reversed every λ/2 pitch.

The distributions of the inner stress and strain may change as a result of the polarization treatment. Accordingly, unless the same temperature and the same electric field are applied to the non-drive electrode also, the changes in strains and stress may not occur in all parts of the ring-shaped body in the circumferential direction by the polarization. As a result, deflection and distortion may occur in the non-drive phase region and cracking, breaking, bonding failures during bonding of the diaphragm 7 to the piezoelectric element, and the like may occur. Accordingly, as shown in FIG. 7C, the non-drive phase may also be subjected to the same polarization treatment.

The polarization treatment may be performed before or after bonding of the diaphragm 7 but preferably before bonding of the diaphragm 7.

Next, a method for producing a stator for an oscillatory wave motor is described. After the diaphragm 7 is bonded to the piezoelectric element 20, the step (B) is performed. In Step (B), some of the polarizing electrodes are selected to be a detection phase electrode and a non-drive phase electrode, and a power input/output wire is connected to a part of a surface of the detection phase electrode and a part of a surface of the non-drive phase electrode at a temperature equal to or higher than the depolarization temperature Td.

The step of bonding the diaphragm 7 to the piezoelectric element 20 is performed by heat-bonding a ring-shape elastic material having the same inner diameter and the outer diameter as those of the piezoelectric material 1 to a common electrode 2-side surface of the polarized piezoelectric element 20 by using an epoxy adhesive or the like. The bonding temperature may be lower than the Curie temperature Tc and the depolarization temperature Td of the piezoelectric material 1. If the bonding temperature is equal to or higher than Tc or Td of the piezoelectric material 1, the absolute value d(1) of the piezoelectric constant of the drive phase of the piezoelectric element 20 may decrease.

Figure 7D:
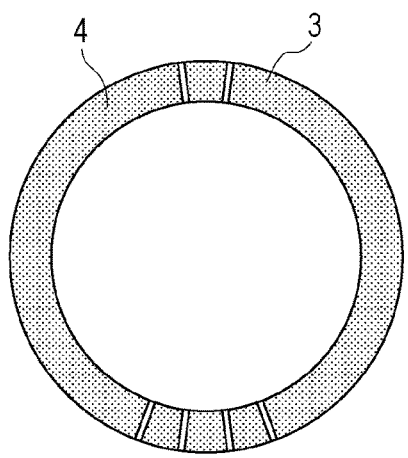

Referring to FIG. 7D, the polarizing electrodes other than the detection phase electrode and the non-drive phase electrodes are connected to form drive phase electrodes 3 and 4. In this step, those polarizing electrodes which are adjacent to one another and formed at a λ/2 pitch are connected to one another with a conductive paste or the like so as to short-circuit between these electrodes and form the drive phase electrode (A-phase electrode) 3 and the drive phase electrode (B-phase electrode) 4. The detection phase electrode 8 may be one electrode selected from the polarizing electrodes that are positioned in the λ/4 region and the 3λ/4 region between the drive phase electrodes 3 and 4. The rest of the electrodes serve as the non-drive phase electrodes 5.

A conductive paste can be used to form short-circuiting wires 10 that connect the common electrode 2 to the non-drive phase electrodes 5 as shown in FIG. 2A. In the step of short-circuiting between the adjacent electrodes and in the step of short-circuiting between the common electrode 2 and the non-drive phase electrodes 5 by using the short-circuiting wires 10, the conductive paste may be heat treated. The heat treatment temperature may be lower than the Curie temperature and the depolarization temperature of the piezoelectric material 1. If the heat treatment temperature is equal to or higher than Tc or Td of the piezoelectric material 1, the absolute value d(1) of the piezoelectric constant of a drive phase of the piezoelectric element 20 may decrease. The heat treatments in these two steps may be performed simultaneously or separately but preferably separately.

Referring to FIG. 2A, the drive phase electrodes 3 and 4, the non-drive phase electrode 5, and the detection phase electrode 8 on the piezoelectric material 1 are aligned so that power can be input and output individually and the input/output wire 9 is connected to the electrodes. A commercially available flexible cable can be used as the input/output wire 9. Connections may be established through heat bonding with an epoxy adhesive or the like. Preferably, connections are established by heat-bonding by using an anisotropic conductive paste (ACP) to reduce conduction failures. More preferably, an anisotropic conductive film (ACF) is used in heat bonding to improve the process speed and promote mass production.

When heat bonding is performed at a temperature equal to or more than the depolarization temperature Td of the piezoelectric material 1, the piezoelectric constant of the piezoelectric material 1 in a portion sandwiched between the detection phase electrode 8 and the common electrode 2 of the stator for an oscillatory wave motor can be decreased. As a result, the absolute value d(2) of the piezoelectric constant of the piezoelectric material 1 in the region sandwiched between the detection phase electrode 8 and the common electrode 2 becomes smaller than the absolute value d(1) of the piezoelectric constant of the piezoelectric material 1 in regions sandwiched between the drive phase electrodes 3 and 4 and the common electrode 2. Heat bonding is more preferably conducted at a temperature equal to or more than the Curie temperature Tc so that the piezoelectric constant of the piezoelectric material 1 in the portion sandwiched between the detection phase electrode 8 and the common electrode 2 can be further lowered or decreased to zero.

Figure 8A:
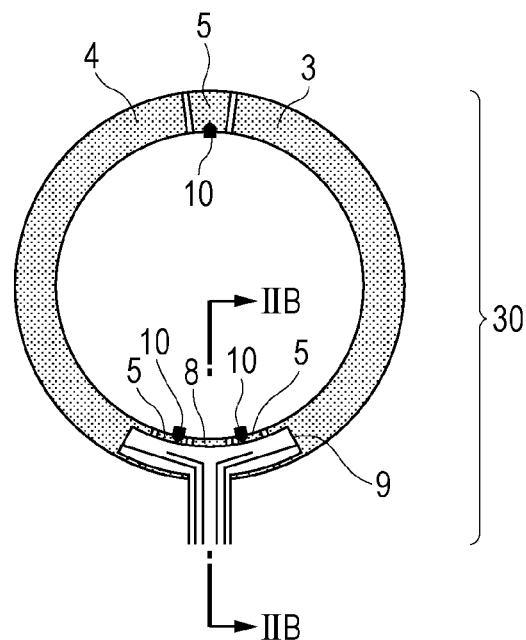
FIGS. 8A to 8C are schematic diagrams showing an example of a method for making a stator for an oscillatory wave motor according to one embodiment.
Figure 8B:
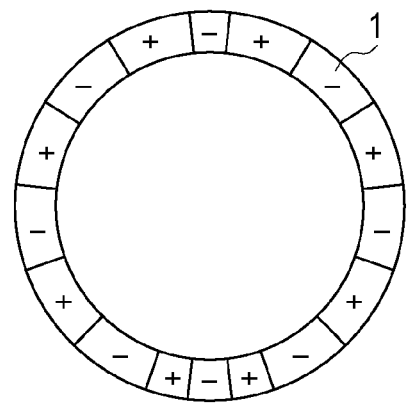
Figure 8C:
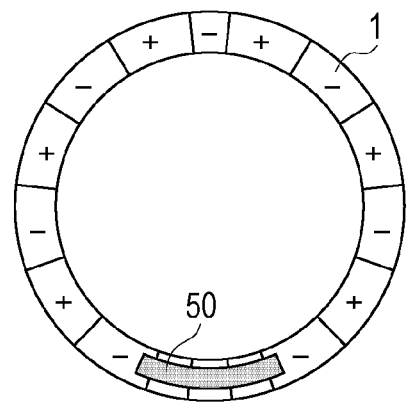

FIGS. 8A to 8C are schematic diagrams showing an example of a method for producing a stator for an oscillatory wave motor according to an embodiment of the invention. FIG. 8A is a schematic plan view of the stator. FIG. 8B is a diagram illustrating the polarity (+ or −) of expansion and contraction of the polarized piezoelectric element 20. FIG. 8C is a schematic diagram illustrating the position of a heat bonding region 50 in connecting the input/output wire 9 on the structure shown in FIG. 8B by using an ACP or ACF. FIGS. 9A to 9D are also schematic diagrams showing an example of a method for producing a stator for an oscillatory wave motor according to an embodiment of the invention. As with FIG. 8C, FIGS. 9A, 9B, 9C, and 9D are schematic diagrams that show the positions of the heat bonding region 50 used in connecting the input/output wire 9 with an ACP or ACF to the structure shown in FIG. 8B. FIGS. 9A to 9D illustrate examples of the position of the heat bonding region 50 other than that shown in FIG. 8C.

As shown in FIGS. 8A to 8C and 9A to 9D, the heat bonding region 50 lies on part of each of the drive phase electrodes 3 and 4, the non-drive phase electrode 5, and the detection phase electrode 8. Thus, the step (B) of connecting the electrodes to the power input/output wire 9 can be performed and, at the same time, the piezoelectric constant of the piezoelectric material 1 can be lowered or decreased to zero only in the portion directly below the heat bonding region 50. Because heat bonding is conducted on parts of the electrodes, the piezoelectric constant of the piezoelectric material 1 remains at the same level as that obtained after polarization treatment in portions of the piezoelectric material 1 directly below the drive phase electrodes 3 and 4, the non-drive phase electrode 5, and the detection phase electrode 8, but not below the heat bonding region 50.

As mentioned above, the piezoelectric constant of a piezoelectric material refers to a piezoelectric constant of a particular part of a single piece of a piezoelectric material. For example, the piezoelectric constant of the piezoelectric material (2) in a portion sandwiched between the detection phase electrode and the common electrode refers to the piezoelectric constant of the entire portion sandwiched between the detection phase electrode 8 and the common electrode 2 among a single piece of the piezoelectric material 1. This definition applies also to the portions sandwiched between the non-drive phase electrodes 5 and the common electrode 2 and the portions sandwiched between the drive phase electrodes 3 and 4 and the common electrode 2. In other words, the absolute value d(1), the absolute value d(2), and the absolute value d(3) can be controlled by conducting this partial heat bonding. In FIGS. 8A to 8C and 9A to 9D, the position of the heat bonding region 50 is schematically illustrated but the position may be any other suitable position. Alternatively, only part of the input/output wire 9 may be heat bonded and the rest of the input/output wire 9 may be simply pressurized without heat bonding.

When the piezoelectric constant of the piezoelectric material 1 in the portion sandwiched between the detection phase electrode 8 and the common electrode 2 can be decreased through the above-described steps, the voltage value of the electrical signal output from the detection phase electrode 8 can be adjusted to be equal to or lower than the upper threshold voltage value set for the phase comparator.

However, this process of decreasing the piezoelectric constant may not always succeed in decreasing the piezoelectric constant to a desired level or may sometimes decrease the piezoelectric constant excessively, thereby excessively decreasing the magnitude of the electrical signal output from the detection phase depending on the relationship between the depolarization temperature Td or Curie temperature Tc of the piezoelectric material 1 and the temperature needed for connecting the input/output wire 9. Accordingly, in order to decrease the piezoelectric constant of the piezoelectric material 1 in a portion sandwiched between the detection phase electrode 8 and the common electrode 2 to a desired level by heat-treatment at a temperature Tf (for example, 180° C.) needed to connect the input/output wire 9, the depolarization temperature Td may be equal to or lower than Tf.

If the depolarization temperature Td of the piezoelectric material is significantly lower than the temperature Tf needed to connect the input/output wire (for example, if Td=Tf−100), portions of the piezoelectric material in the A phase and the B phase become heated by heat conduction from the input/output wire 9 and the piezoelectric constant decreases rapidly. Accordingly, the depolarization temperature Td of the piezoelectric material 1 is preferably equal to or higher than Tf−100° C. and equal to or lower than Tf and more preferably in the range of 100° C. or more and 200° C. or less.

As shown in FIGS. 8A to 8C and 9A to 9D, the heat bonding region 50 lies in some parts of the drive phase electrodes 3 and 4, the non-drive phase electrodes 5, and the detection phase electrode 8. Thus, the step (B) of connecting the electrodes to the power input/output wire 9 can be performed and, simultaneously the piezoelectric constant of the piezoelectric material 1 can be lowered or decreased to zero only in the portions that are directly below the heat bonding region 50. Alternatively, the step (B) of connecting the electrodes to the power input/output wire 9 can be performed on all parts of the non-drive phase electrodes 5 and the detection phase electrode 8. In such a case, a step (C) of re-polarizing the piezoelectric material in the portions under the non-drive phase electrodes 5 and the detection phase electrode 8 is performed after the step (B). The piezoelectric constant of the piezoelectric material in portions overlaid by the non-drive phase electrodes 5 and the detection phase electrode 8 can be adjusted by conducting the re-polarization treatment after the step (B).

The temperature of the re-polarization treatment is preferably set in the range that does not cause detachment of the adhesive at the diaphragm bonding portion and the connecting portions of the input/output wire 9. The temperature is, for example, 60° C. or lower. More preferably, the temperature of the re-polarization treatment is room temperature (25° C.) since the re-polarization treatment can be conducted without rarely adversely affecting the adhesive. The electric field applied in conducting the re-polarization treatment may be set within the range that does not cause discharge between wires of the input/output wire 9, for example.

Figure 10A:
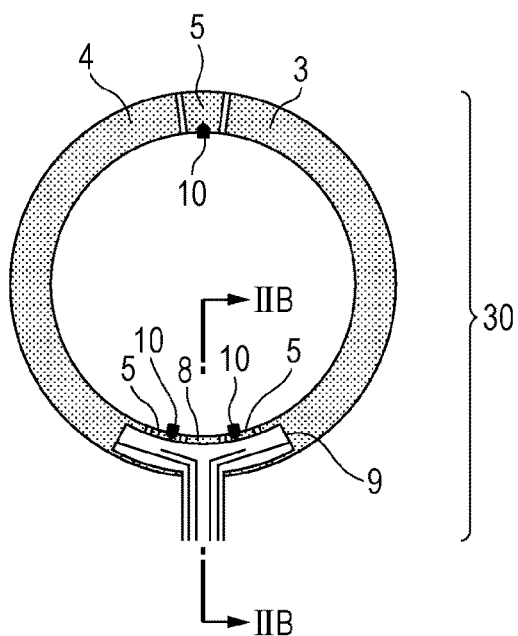
FIGS. 10A to 10C are schematic views showing an example of a method for making a stator for an oscillatory wave motor according to one embodiment.
Figure 10B:
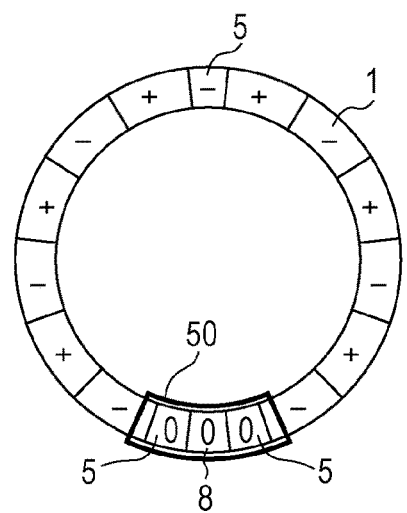
Figure 10C:
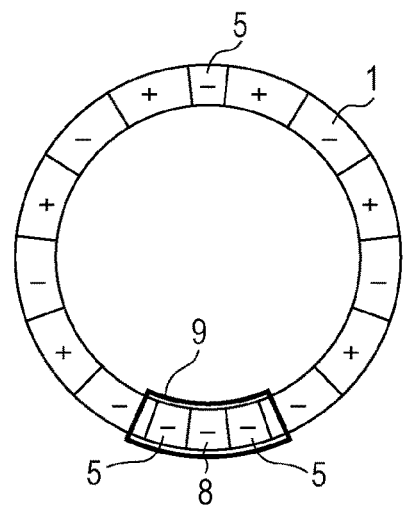

FIGS. 10A to 10C are schematic views showing an example of a method for producing a stator for an oscillatory wave motor according to an embodiment of the invention. FIG. 10A is a schematic plan view of the stator for an oscillatory wave motor. FIG. 10B is a schematic diagram showing the state in which all parts of the non-drive phase electrodes 5 and the detection phase electrode 8 are heat-bonded to the input/output wire 9 in the step (B) at a temperature equal to or higher than the Curie temperature Tc so that the piezoelectric constant of the piezoelectric material 1 is lost in the portions directly below the heat bonding region 50. In the drawing, the signs (+, −) indicate the polarity of expansion and contraction of the polarized piezoelectric element 20 and (0) indicates that the piezoelectric constant is zero. There is a non-drive phase electrodes 5 in the upper part of the drawing and this non-drive phase electrode 5 has a (−) polarity of expansion and contraction. For the purposes of the invention, it is sufficient to conduct the step (B) on at least one of the non-drive phase electrodes 5.

FIG. 10C is a schematic diagram showing the state in which the step (C) of re-polarizing the piezoelectric material 1 in portions under the non-drive phase electrodes 5 and the detection phase electrode 8 is performed. The re-polarization treatment may be performed so that the portions under the non-drive phase electrodes 5 and the portion under the detection phase electrode 8 have the same potential, in other words, so that all of the re-polarized portions under the non-drive phase electrodes 5 and the detection phase electrode 8 have either + or − polarity of expansion and contraction. When the polarization treatment is conducted so that these portions all have the same potential, the wires in the input/output wire 9 come to have the same potential. Thus, when power is supplied through the input/output wire 9 to conduct re-polarization, for example, discharge does not occur among the wires in the input/output wire 9. As a result, the re-polarization treatment can be conducted with a larger electric field. The re-polarization treatment may be conducted on the drive phase electrodes 3 and 4 through the input/output wire 9.

The order in which the step of bonding the diaphragm 7 to the piezoelectric element 20, the step of preparing the drive phase electrodes 3 and 4 by connecting polarizing electrodes, and the step of connecting the common electrode 2 to the non-drive phase electrodes 5 through the short-circuiting wires 10 are performed relative to the steps (A), (B), and (C) above is not limited to that described above as long as the piezoelectric constant of the piezoelectric material 1 in the region sandwiched between the detection phase electrode 8 and the common electrode 2 is smaller than piezoelectric constant of the piezoelectric material 1 in the regions sandwiched between the drive phase electrodes 3 and 4 and the common electrode 2. In this respect, only the order in which the steps (A), (B), and (C) are performed is important.

For example, in the case where the re-polarization step (C) is to be conducted, the step of preparing the drive phase electrodes 3 and 4 by connecting the polarizing electrodes 33 and the step of connecting the common electrode 2 to the non-drive phase electrodes 5 through the short-circuiting wires 10 may be performed after the re-polarization step (C) the re-polarization treatment can be conducted on the polarizing electrodes 33 by using the wires in the input/output wire 9 that have the same potential. Note that when the re-polarization step (C) is to be conducted, the step (B) of connecting the power input/output wire at a temperature equal to or higher than the depolarization temperature Td of the piezoelectric material may be performed in some or all parts of the surface of the detection phase electrode 8 and in some or all parts of the surfaces of the non-drive phase electrodes 5.

A stator 30 for an oscillatory wave motor according to an embodiment of the invention is obtained through a series of production steps described above. Then a oscillatory wave motor 40 is obtained by causing a ring-shape elastic body having the same inner and outer diameters as those of the stator 30 to pressure-contact the stator 30 so that the elastic body serves as a rotor 6. Finally, a driving control circuit that includes a phase comparator is to the input/output wire 9 so as to form a driving control system for an oscillatory wave motor.

In the description above, some embodiments of the piezoelectric element, the stator for an oscillatory wave motor, the oscillatory wave motor, the driving control system, and the optical apparatus according to the present invention have been described. These may be manufactured by methods different from those described above. For example, the absolute value d(2) of the piezoelectric constant of the piezoelectric material (2) in a portion sandwiched between the detection phase electrode 8 and the common electrode 2 and the absolute value d(3) of the piezoelectric constant of the piezoelectric material (3) in portions sandwiched between the non-drive phase electrodes 5 and the common electrode 2 may be adjusted to be smaller than the absolute value d(1) of the piezoelectric constant of the piezoelectric material (1) in portions sandwiched between the drive phase electrodes 3 and 4 and the common electrode 2 by adjusting the electric field applied to the polarizing electrodes 33 or by applying heat through an appropriate mechanism.

EXAMPLES

An embodiment of the oscillatory wave motor will now be described by way of Examples which do not limit the scope of the invention. In Examples, the reference numerals in the drawings are used to described components, parts, etc.

Example 1

A method for preparing a piezoelectric material is first described.

Raw materials, namely, barium titanate (BT-01 produced by Sakai Chemical Industry Co., Ltd.) having a mean particle size of 100 nm, calcium titanate (CT-03 produced by Sakai Chemical Industry Co., Ltd.) having a mean particle size of 300 nm, and calcium zirconate (CZ-03 produced by Sakai Chemical Industry Co., Ltd.) having a mean particle size of 300 nm, were weighed so that the molar ratio of these materials was 81.3:12.7:6.0.

Next, the weighed powder materials were dry-mixed in a ball mill for 24 hours. The powder mixture obtained thereby was formed into a powder by allowing manganese(II) acetate in an amount of 0.26 parts by weight on a metallic Mn basis relative to the powder mixture and a PVA binder in an amount of 3 parts by weight relative to the powder mixture to adhere to surfaces of particles of the powder mixture by using a spray drier.

A mold was filled with the resulting powder and a disk-shape compact was formed by using a press forming machine at a forming pressure of 200 MPa. The compact may be further pressurized by using a cold isotactic forming machine.

The compact was placed in an electric furnace, held at a maximum temperature of 1380° C. for 5 hours, and sintered in air for a total of 24 hours.

The composition of the piezoelectric material was determined by X-ray fluorescence analysis. As a result, the composition was identified to be $(Ba_{0.813}Ca_{0.187})(Ti_{0.94}Zr_{0.06})O_3$ containing 0.26 parts by weight of Mn. This shows that the composition as weighed is the same as the composition after sintering. The contents of elements other than Ba, Ca, Ti, Zr, and Mn were below detection limits and were not more than 1 part by weight.

The sintered piezoelectric material 1 was ground to prepare a ring-shape body. A silver paste was applied to both sides of the ring-shape body by screen printing to form a pattern for a common electrode 2 and a pattern for polarizing electrodes. The distance between the adjacent polarizing electrodes was 0.5 mm.

The ring-shape piezoelectric material 1 having an approximately uniform thickness of 0.5 mm was polarized in air using a DC power source by applying a 1 kV/mm electric field. The atmosphere temperature was 100° C., a 1 kV/mm electric field was applied, and the voltage application time was 180 minutes at 100° C.

A ring-shape piezoelectric element 20 was sampled as a reference sample. A rectangular prism having an aspect ratio corresponding to a length of λ/4 and a width equal to the width of a polarizing electrode was cut out from the sample at a position corresponding to a polarizing electrode 33 near the central portion of the A phase electrode. The change in dielectric constant of this rectangular prism piezoelectric material was measured in a thermostatic chamber while elevating the temperature to determine the temperature Tc at which the dielectric constant was maximal. Tc was found to be 105° C. Another rectangular prism piezoelectric material cut out in the same manner was heated and held on a hot plate for 10 minutes to form a piezoelectric element. The piezoelectric element was measured with a piezoelectric constant measuring device, $d_{33}$ meter (produced by Alpha Corporation) via a Berlincourt method to determine the constant $d_{33}$ at room temperature. The measurement was repeated while increasing the temperature of heating and holding in increments of 5° C. and the depolarization temperature Td at which the piezoelectric constant was 95% or less of the initial level was determined. As a result, Td was found to be 90° C.

Next, the piezoelectric element 20 was heat bonded to a diaphragm 7 composed of stainless steel with an epoxy adhesive at a temperature lower than the depolarization temperature Td of the piezoelectric material. Among the polarizing electrodes, those formed at λ/2 pitches and adjacent to each other were connected to each other by using a conductive paste by screen printing to form an A-phase electrode 3 and a B-phase electrode 4. Then the common electrode 2 and all of the non-drive phase electrodes 5 were connected through short-circuiting wires 10 formed of a conductive paste so as to form a stator 30 for an oscillatory wave motor. The conductive paste was heat treated at a temperature lower than the depolarization temperature Td of the piezoelectric material.

Next, as shown in FIGS. 8A to 8C, the stator 30 for an oscillatory wave motor was heat bonded to an input/output wire 9 formed of a flexible cable by using an anisotropic conductive film (ACF) at 180° C. The heat bonding region 50 was as shown in FIG. 8C. The stator 30 for an oscillatory wave motor was brought into press-contact with a rotor 6 to form an oscillatory wave motor 40. An oscillatory wave motor control system was formed by connecting a driving control circuit to the input/output wire 9 of the oscillatory wave motor 40.

The oscillatory wave motor control system formed as such was used to drive the oscillatory wave motor so that the load on the rotor was 150 g·cm and the maximum rotation rate was 100 rpm. As a result, the voltage output from the detection phase was 0.4 times the input voltage.

The stator 30 for an oscillatory wave motor was immersed for a day and a night in acetone in an ultrasonic wave washer. As a result, the piezoelectric element 20 came off from the diaphragm 7 composed of stainless steel and the input/output wire 9. Rectangular prism samples having an aspect ratio corresponding a length of λ/4 and a width equal to the width of a polarizing electrode were cut out from the piezoelectric element 20 from the following regions: the region corresponding to the polarizing electrode 33 near the center of the A phase electrode, the region where the detection phase electrode 8 lay, and the region where the non-drive phase electrode 5 lay. These samples were respectively used as an evaluation piezoelectric element sample for a drive phase electrode, an evaluation piezoelectric element sample for a detection phase electrode, and an evaluation piezoelectric element sample for a non-drive phase electrode. These evaluation piezoelectric element samples were measured at a room temperature by a Berlincourt method to determine the constant $d_{33}$. It was found that the absolute value of the piezoelectric constant of the evaluation piezoelectric element sample for a detection phase electrode was 0.6 times the absolute value of the piezoelectric constant of the evaluation piezoelectric element sample for the drive phase electrode. The difference between the absolute value of the piezoelectric constant of the evaluation piezoelectric element for a detection phase electrode and the absolute value of the piezoelectric constant of the evaluation piezoelectric element for a non-drive phase electrode was 3%.

Example 2

Figure 9A:
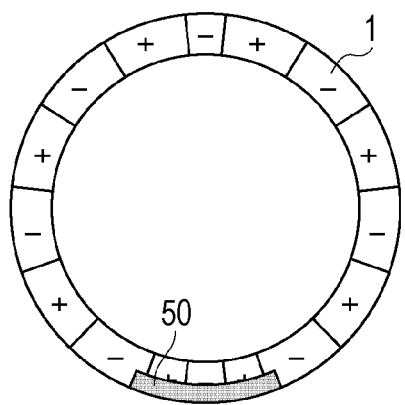
FIGS. 9A to 9D are schematic diagrams showing examples of a method for making a stator for an oscillatory wave motor according to one embodiment.
Figure 9B:
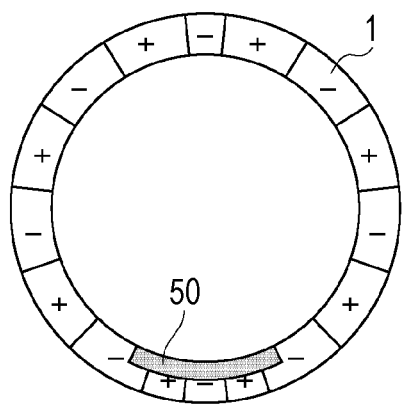

In this example, a piezoelectric material 1 having a composition represented by $(Ba_{0.84}Ca_{0.16})(Ti_{0.941}Zr_{0.059})O_3$ containing 0.36 parts by weight of Mn was prepared, and an oscillatory wave motor control system was made by the same method as in Example 1 except that the heat bonding region 50 for connecting the stator 30 for an oscillatory wave motor to the input/output wire 9 formed of a flexible cable was as shown in FIG. 9A.

The composition of the piezoelectric material was determined by X-ray fluorescence analysis. As a result, the composition was identified to be $(Ba_{0.84}Ca_{0.16})(Ti_{0.941}Zr_{0.059})O_3$ containing 0.36 parts by weight of Mn. This shows that the composition as weighed is the same as the composition after sintering. The contents of elements other than Ba, Ca, Ti, Zr, and Mn were below detection limits and were not more than 1 part by weight.

Example 3

Figure 9C:
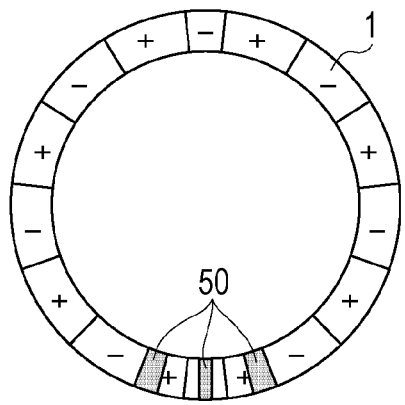
Figure 9D:
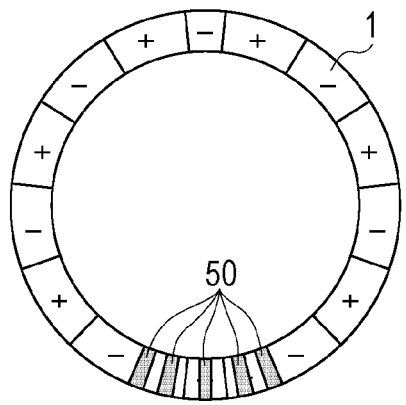

In this example, a piezoelectric material 1 having a composition represented by $(Ba_{0.86}Ca_{0.14})(Ti_{0.938}Zr_{0.054}Sn_{0.008})O_3$ containing 0.26 parts by weight of Mn was prepared, and an oscillatory wave motor control system was made by the same method as in Example 1. Calcium stannate having a mean particle size of 300 nm and prepared by a solid phase method was used as the raw material of Sn. The heat bonding region 50 for connecting the stator 30 for an oscillatory wave motor to the input/output wire 9 formed of a flexible cable was as shown in FIG. 9D.

The composition of the piezoelectric material was determined by X-ray fluorescence analysis. As a result, the composition was identified to be $(Ba_{0.86}Ca_{0.14})(Ti_{0.938}Zr_{0.054}Sn_{0.008})O_3$ containing 0.26 parts by weight of Mn. This shows that the composition as weighed is the same as the composition after sintering. The contents of elements other than Ba, Ca, Ti, Zr, Sn, and Mn were below detection limits and were not more than 1 part by weight.

Example 4

In this example, a piezoelectric material 1 having a composition represented by $BaTiO_3$ containing 0.12 parts by weight of Mn was prepared, and an oscillatory wave motor control system was made by the same method as in Example 1. However, the sintering was performed in air at 1340° C. for 5 hours. The heat bonding region 50 for connecting the stator 30 for an oscillatory wave motor to the input/output wire 9 formed of a flexible cable was as shown in FIG. 9C.

Example 5

In this example, a ring-shape piezoelectric element 20 was prepared from the same material and by the same method as in Example 3 and subjected to a polarization treatment. The resulting piezoelectric element 20 was heat-bonded to a diaphragm 7 composed of stainless steel with an epoxy adhesive at a temperature lower than depolarization temperature Td of the piezoelectric material.

Next, an input/output wire 9 formed of a flexible cable was heat bonded at 180° C. with an anisotropic conductive film (ACF) to a component constituted by the piezoelectric element 20 and the diaphragm 7 attached to the piezoelectric element 20. The heat bonding region 50 was as shown in FIG. 10B. A 0.5 kV/mm electric field was applied through the input/output wire 9 formed of a flexible cable at room temperature for 10 minutes to re-polarize the portions under the electrodes connected to the input/output wire 9 formed of a flexible cable. As shown in FIG. 10C, the re-polarization treatment was conducted so that all of the portions under the electrodes connected to the input/output wire 9 have a (−) polarity of expansion and contraction.

Among the polarizing electrodes, those formed at λ/2 pitches and adjacent to each other were connected to each other by using a conductive paste by screen printing to form an A-phase electrode 3 and a B-phase electrode 4. Then the common electrode 2 and all of the non-drive phase electrodes 5 were connected through short-circuiting wires 10 formed of a conductive paste. The conductive paste was heat treated at a temperature lower than the depolarization temperature Td of the piezoelectric material to form a stator 30 for an oscillatory wave motor. The stator 30 was brought into pressure-contact with a rotor 6 so as to form an oscillatory wave motor 40. A driving control circuit was connected to the input/output wire 9 to form an oscillatory wave motor control system.

Example 6

In this example, $K_2CO_3$, $Na_2CO_3$, $Nb_2O_5$, and $Ta_2O_5$ were used as the raw materials. A piezoelectric material 1 was prepared therefrom so that a perovskite-type sintered body $(K,Na)(Nb,Ta)O_3$ having a desired composition ratio was obtained. Other steps were the same as in Example 5 and an oscillatory wave motor control system was produced. The firing was performed in air at 1300° C. for 3 hours. The re-polarization treatment was performed by applying a 0.5 kV/mm electric field through the input/output wire 9 formed of a flexible cable at 60° C. for 30 minutes. As shown in FIG. 10C, the re-polarization treatment was conducted so that the regions under all of the electrodes connected to the input/output wire 9 had the (−) polarity of expansion and contraction.

Comparative Example 1

A commercially available lead zirconate titanate (PZT) was used to form a ring-shape piezoelectric material 1 of Comparative Example 1.

The ring-shape piezoelectric material 1 was polarized in air by using a DC power source by applying an electric field having an intensity of 0.6 kV/mm. The voltage application time was 30 minutes at 220° C.

A ring-shape piezoelectric element 20 was sampled as a reference sample. A rectangular prism having an aspect ratio corresponding to a length of λ/4 and a width equal to the width of a polarizing electrode was cut out from the sample at a position corresponding to a polarizing electrode 33 near the central portion of the A phase electrode. The change in dielectric constant of the rectangular prism-shape piezoelectric material was measured in a thermostatic chamber while elevating the temperature so as to determine the temperature Tc at which the dielectric constant is maximal. As a result, Tc was found to be 310° C. Another rectangular prism piezoelectric material cut out in the same manner was heated and held on a hot plate for 10 minutes to form a piezoelectric element. The constant $d_{33}$ of the piezoelectric element was measured via a Berlincourt method at room temperature. The measurement was repeated while increasing the temperature of heating and holding in increments of 5° C. and the depolarization temperature Td was determined. Td was found to be 250° C.

Next, the piezoelectric element 20 was heat bonded to a diaphragm 7 composed of stainless steel with an epoxy adhesive at a temperature lower than the depolarization temperature Td of the piezoelectric material. Among the polarizing electrodes, those formed at λ/2 pitches and adjacent to each other were connected to each other by using a conductive paste by screen printing to form an A-phase electrode 3 and a B-phase electrode 4. Then the common electrode 2 and all of the non-drive phase electrodes 5 were connected through short-circuiting wires 10 formed of a conductive paste so as to form a stator 30 for an oscillatory wave motor. The conductive paste was heat treated at a temperature lower than the depolarization temperature Td of the piezoelectric material.

Next, as shown in FIGS. 8A to 8C, the stator 30 for an oscillatory wave motor was heat bonded to an input/output wire 9 formed of a flexible cable by using an anisotropic conductive film (ACF) at 180° C. The heat bonding region 50 was as shown in FIG. 8C. The stator 30 for an oscillatory wave motor was brought into press-contact with a rotor 6 to form an oscillatory wave motor 40. An oscillatory wave motor control system was formed by connecting a driving control circuit to the input/output wire 9 of the oscillatory wave motor 40.

The oscillatory wave motor control system formed as such was used to drive the oscillatory wave motor so that the load on the rotor was 150 g·cm and the maximum rotation rate was 100 rpm. As a result, the voltage output from the detection phase was 0.8 times the input voltage. For example, the output voltage was 70 to 120 V and a trouble that the phase comparator of the phase detector circuit did not output the phase difference information occurred.

The stator 30 for an oscillatory wave motor was immersed for a day and a night in acetone in an ultrasonic wave washer. As a result, the ring-shape piezoelectric element 20 came off from the diaphragm 7 composed of stainless steel and the input/output wire 9. Rectangular prism samples having an aspect ratio corresponding a length of $\lambda/4$ and a width equal to the width of a polarizing electrode were cut out from the piezoelectric element 20 from the following regions: the region corresponding to the polarizing electrode 33 near the center of the A phase electrode, the region where the detection phase electrode 8 lay, and the region where the non-drive phase electrode 5 lay. These samples were respectively used as an evaluation piezoelectric element sample for a drive phase electrode, an evaluation piezoelectric element sample for a detection phase electrode, and an evaluation piezoelectric element sample for a non-drive phase electrode. The constant $d_{33}$ of these evaluation piezoelectric element samples were measured at room temperature by a Berlincourt method. It was found that the absolute value of the piezoelectric constant of the evaluation piezoelectric element sample for a detection phase electrode was 1.0 times the absolute value of the piezoelectric constant of the evaluation piezoelectric element sample for the drive phase electrode.

Comparative Example 2

In this comparative example, a piezoelectric material 1 was prepared from the same raw materials and by the same method as in Example 3 and an oscillatory wave motor control system was produced by the same method as in Example 1. The heat bonding region 50 for connecting the stator 30 for an oscillatory wave motor to the input/output wire 9 formed of a flexible cable was as shown in FIG. 10B. The heat bonding time was ⅓ of that in Example 3.

The oscillatory wave motor control system formed as such was used to drive the oscillatory wave motor so that the load on the rotor was 150 g·cm and the maximum rotation rate was 100 rpm. However, the maximum rotation rate could not be controlled to 100 rpm. The voltage output from the detection phase was 0.001 times the input voltage and the absolute value of the piezoelectric constant of the evaluation piezoelectric element sample for the detection phase electrode was 0.5 pC/N.

Comparative Example 3

In this comparative example, an oscillatory wave motor control system was produced as in Example 3. However, after the input/output wire 9 formed of a flexible cable was heat bonded to the stator 30 for an oscillatory wave motor, all parts of the two non-drive phase electrodes 5 were heated at 120° C. for 20 seconds from above the flexible cable.

The oscillatory wave motor control system formed as such was used to drive the oscillatory wave motor so that the load on the rotor was 150 g·cm and the maximum rotation rate was 100 rpm. However, it was difficult to control the maximum rotation rate to 100 rpm because of the variation in rotation rate of the oscillatory wave motor relative to the input voltage. Moreover, in heat bonding the piezoelectric element 20 to the diaphragm 7, cracking, breaking, and adhesion failures occurred in a large number of elements.

The results of Examples and Comparative Examples are shown in Table 1.

TABLE 1

| | Material | Tc (° C.) | Td (° C.) | Re-polarization temperature (° C.) | Re-polarization field (k/mm) | Re-polarization time (min) | Voltage output from detection phase/Input voltage (—) | d(2)/d(1) (—) | d(3)/d(2) (—) |
|---|---|---|---|---|---|---|---|---|---|
| Example 1 | (I)BCTZ-Mn | 105 | 90 | — | — | — | 0.4 | 0.6 | 0.97 |
| Example 2 | (II)BCTZ-Mn | 105 | 95 | — | — | — | 0.2 | 0.3 | 1.03 |
| Example 3 | BCTZS-Mn | 105 | 100 | — | — | — | 0.02 | 0.05 | 0.96 |
| Example 4 | BTO-Mn | 130 | 100 | — | — | — | 0.01 | 0.02 | 1.06 |
| Example 5 | BCTZS-Mn | 105 | 95 | Room temperature | 0.5 | 10 | 0.1 | 0.1 | 1.01 |
| Example 6 | KNNT | 200 | 180 | 60 | 0.5 | 30 | 0.4 | 0.5 | 0.94 |
| Comparative Example 1 | PZT | 310 | 250 | — | — | — | 0.8 | 1 | — |
| Comparative Example 2 | BCTZS-Mn | 105 | 100 | — | — | — | 0.001 | 0.002 | — |
| Comparative Example 3 | BCTZS-Mn | 105 | 95 | — | — | — | 0.01 | 0.08 | 0.8 |

Meanings of the abbreviations in the table are as follows:
(I) BCTZ-Mn: $(Ba_{0.813}Ca_{0.187})(Ti_{0.94}Zr_{0.06})O_3$+Mn 0.26 parts by weight
(II) BCTZ-Mn: $(Ba_{0.84}Ca_{0.16})(Ti_{0.941}Zr_{0.059})O_3$+Mn 0.36 parts by weight
BCTZS-Mn: $(Ba_{0.86}Ca_{0.14})(Ti_{0.938}Zr_{0.054}Sn_{0.008})O_3$+Mn 0.26 parts by weight
BTO-Mn: $BaTiO_3$+Mn 0.12 parts by weight
KNNT: $(K,Na)(Nb,Ta)O_3$
PZT: $Pb(Zr,Ti)O_3$ When the load on the rotor was controlled to 150 g·cm and the maximum rotation rate was controlled to 100 rpm, the input voltage in Examples 1, 2, 3, and 5 and Comparative Example 1 was 0.8 times that in Example 4 and Comparative Example 3 or less. Thus, the driving efficiency was satisfactory. However, as mentioned above, the output voltage in Comparative Example 1 was large, i.e., 0.8 times the input voltage and no improvements in driving efficiency was observed.

The phase transition temperature Tr of Example 4 was within the range of 0° C. or more and 35° C. or less. In Examples 1, 2, 3, and 5, the phase transition temperature Tr was not in the range of −5° C. or more and 50° C. or less.

In the piezoelectric materials 1 and the oscillatory wave motor control systems used in Examples 1, 2, 3, and 5, the variation in input voltage at which the load on the rotor was 150 g·cm and the maximum rotation rate was 100 rpm could be suppressed within ±10% against a change of 5° C. or more in ambient temperature.

INDUSTRIAL APPLICABILITY

According to a piezoelectric element, a stator for an oscillatory wave motor, an oscillatory wave motor, and a driving control system of the invention, the output voltage can be made lower than the input voltage. Thus, they can be applied to various types of resonance devices such as ring-shape oscillatory wave motors, multilayer oscillatory wave motors, and rod-shape oscillatory wave motors.

ADVANTAGEOUS EFFECTS OF INVENTION

According to the present invention, a piezoelectric element capable of lowering the output voltage for detection relative to the input voltage for driving without requiring a step-down circuit between a detection phase electrode and a phase comparator which have been necessary in the related art can be provided. A stator for an oscillatory wave motor, an oscillatory wave motor, and an oscillatory wave motor driving control system that use the piezoelectric element can also be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-283088, filed Dec. 26, 2012, which is hereby incorporated by reference herein in its entirety.

REFERENCE SIGNS LIST 1 piezoelectric material
2 common electrode
3 drive phase electrode (A phase electrode)
4 drive phase electrode (B phase electrode)
5 non-drive phase electrode
6, 725c rotor
7, 725b diaphragm
8 detection phase electrode
9 input/output wire
10 short-circuiting wire
11 first surface
12 second surface
20 piezoelectric element
30 stator for oscillatory wave motor
33 polarizing electrode
40, 725 oscillatory wave motor
50 heat bonding region
702 rear group lens (focus lens)
711 mount
712 fixed barrel
713 linear guide barrel 713
714 front lens group barrel
715 cam ring
716 rear lens group barrel
717 cam roller
718 shaft screw
719 roller
720 rotation transmitting ring
722 roller
724 manual focus ring
726 wave washer
727 ball race
728 focus key
729 joint member
732 washer
733 low-friction sheet

The invention claimed is:

1. A piezoelectric element comprising:
   a single piece of a piezoelectric material having a first surface and a second surface;
   a common electrode disposed on the first surface;
   a plurality of drive phase electrodes disposed on the second surface;
   a detection phase electrode disposed on the second surface; and
   a non-drive phase electrode disposed on the second surface,
   wherein an absolute value d(1) of a piezoelectric constant of the piezoelectric material (1) in portions sandwiched between the plurality of drive phase electrodes and the common electrode, an absolute value d(2) of a piezoelectric constant of the piezoelectric material (2) in a portion sandwiched between the detection phase electrode and the common electrode, and an absolute value d(3) of a piezoelectric constant of the piezoelectric material (3) in a portion sandwiched between the non-drive phase electrode and the common electrode satisfy relationships d(2)<0.95d(1), d(3)<0.95d(1), and 0.9≤d(3)/d(2)≤1.1.

2. The piezoelectric element according to claim 1, wherein the absolute value d(2) of the piezoelectric constant of the piezoelectric material (2) is 0.7 times the absolute value d(1) of the piezoelectric constant of the piezoelectric material (1) or less.

3. The piezoelectric element according to claim 1, wherein the piezoelectric material contains less than 1000 ppm of lead.

4. The piezoelectric element according to claim 1, wherein the piezoelectric material is a piezoelectric ceramic material containing barium titanate as a main component.

5. The piezoelectric element according to claim 1, wherein the piezoelectric material contains as a main component a perovskite-type metal oxide represented by general formula (1) below:

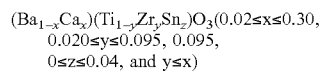

$(Ba_{1-x}Ca_x)(Ti_{1-y}Zr_ySn_z)O_3$ (0.02≤x≤0.30, 0.020≤y≤0.095, 0.095, 0≤z≤0.04, and y≤x)   General formula (1).

6. The piezoelectric element according to claim 5, wherein the perovskite-type metal oxide contains Mn and a Mn content relative to 100 parts by weight of the perovskite-type metal oxide is 0.02 parts by weight or more and 0.40 parts by weight or less on a metal basis.

7. A stator for an oscillatory wave motor, comprising:
   the piezoelectric element according to claim 1, the piezoelectric element having a first surface and a second surface;
   a diaphragm disposed on the first surface; and
   a power input/output wire disposed on the second surface.

8. An oscillatory wave motor comprising the stator for an oscillatory wave motor according to claim 7.

9. A driving control system comprising the oscillatory wave motor according to claim 8.

10. An optical apparatus comprising the driving control system according to claim 9.

11. A method for producing the stator for an oscillatory wave motor according to claim 7, the method comprising:
  (A) forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as to polarize the piezoelectric material and obtain a piezoelectric element; and
  (B) selecting which of the polarizing electrodes are to be a detection phase electrode and a non-drive phase electrode and connecting a power input/output wire to a part of a surface of the detection phase electrode and a part of a surface of the non-drive phase electrode at a temperature equal to or higher than a depolarization temperature Td of the piezoelectric material.

12. A method for producing the stator for an oscillatory wave motor according to claim 7, the method comprising:
  (A) forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as to polarize the piezoelectric material and obtain a piezoelectric element;
  (B) selecting which of the polarizing electrodes are to be a detection phase electrode and a non-drive phase electrode and connecting a power input/output wire to a part or all parts of a surface of the detection phase electrode and a part or all parts of a surface of the non-drive phase electrode at a temperature equal to or higher than a depolarization temperature Td of the piezoelectric material; and
  (C) re-polarizing the piezoelectric material in portions sandwiched between the detection phase electrode and the common electrode and between the non-drive phase electrode and the common electrode.

13. The method according to claim 12, wherein, the re-polarizing (C) is conducted by applying voltages of the same polarity to the detection phase electrode and the non-drive phase electrode so that the portions sandwiched between the detection phase electrode and the common electrode and between the non-drive phase electrode and the common electrode exhibit the same polarity of expansion and contraction.

14. The method according to 11, wherein the depolarization temperature Td is 100° C. or higher and 200° C. or lower.

* * * * *